US009092046B2

(12) United States Patent
Moore et al.

(10) Patent No.: US 9,092,046 B2
(45) Date of Patent: Jul. 28, 2015

(54) ADAPTIVE VOLTAGE SCALERS (AVSS), SYSTEMS, AND RELATED METHODS

(71) Applicant: QUALCOMM Incorporated, San Diego, CA (US)

(72) Inventors: Richard Alan Moore, Raleigh, NC (US); Gerald Paul Michalak, Cary, NC (US); Jeffrey Todd Bridges, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/251,674

(22) Filed: Apr. 14, 2014

(65) Prior Publication Data

US 2014/0225658 A1  Aug. 14, 2014

Related U.S. Application Data

(62) Division of application No. 12/750,123, filed on Mar. 30, 2010, now Pat. No. 8,797,095.

(60) Provisional application No. 61/164,882, filed on Mar. 30, 2009, provisional application No. 61/222,779, filed on Jul. 2, 2009.

(51) Int. Cl.
*G05F 1/10* (2006.01)
*G06F 1/32* (2006.01)
(Continued)

(52) U.S. Cl.
CPC .............. *G05F 1/462* (2013.01); *G06F 1/3203* (2013.01); *G06F 1/324* (2013.01); *G06F 1/3234* (2013.01);
(Continued)

(58) Field of Classification Search
CPC ....... G06F 1/32; G06F 1/3203; G06F 1/3234; G06F 1/3296
USPC .......... 327/276, 277, 284, 530, 538, 540, 544
See application file for complete search history.

(56) References Cited

U.S. PATENT DOCUMENTS 7,257,723 B2   8/2007  Galles
7,289,921 B1  10/2007  Salmi et al.
(Continued)

FOREIGN PATENT DOCUMENTS

CN         1983119 A    6/2007
CN       101006644 A    7/2007
(Continued)

OTHER PUBLICATIONS

Ankur Gupta, et al., "A Robust Level-Shifter Design for Adaptive Voltage Scaling" VLSI Design, 2008. VLSID 2208. 21st International Conference on, IEEE, Piscataway, NJ, USA, Jan. 4, 2008, pp. 383-388, XP031230070 ISBN: 978-0-7695-3083-3.

(Continued)

*Primary Examiner* — William Hernandez
(74) *Attorney, Agent, or Firm* — Peter Michael Kamarchik; Nicholas J. Pauley; Joseph Agusta

(57) ABSTRACT

Adaptive voltage scalers (AVSs), systems, and related methods are disclosed. The AVSs are configured to adaptively adjust voltage levels powering a functional circuit(s) based on target operating frequencies and delay variation conditions to avoid or reduce voltage margin. In one embodiment, the AVS includes an AVS database. The AVS database can be configured to store voltage levels for various operating frequencies of a functional circuit(s) to avoid or reduce voltage margin. The AVS database allows rapid voltage level decisions. The voltage levels stored in the AVS database may be initial, minimum, learned, populated, explored, backed out, temperature-based, and/or age-based voltage levels according to disclosed embodiments to further avoid or reduce voltage margin. An AVS module may be a software-based module that consults the AVS database to make voltage level decisions. Providing the AVS module as a software-based module may allow flexibility in configuring the AVS module and/or the AVS database.

29 Claims, 18 Drawing Sheets

(51) Int. Cl.
*G05F 1/46* (2006.01)
*H03K 3/012* (2006.01)

(52) U.S. Cl.
CPC .............. *G06F 1/3296* (2013.01); *H03K 3/012* (2013.01); *Y02B 60/1217* (2013.01); *Y02B 60/1285* (2013.01)

(56) References Cited

U.S. PATENT DOCUMENTS

| | | |
|---|---|---|
| 7,417,482 B2 | 8/2008 | Elgebaly et al. |
| 8,004,329 B1 | 8/2011 | Liu et al. |
| 8,378,738 B1 | 2/2013 | Zhu et al. |
| 8,519,781 B1 | 8/2013 | Zhu et al. |
| 8,531,225 B1 | 9/2013 | Hussain |
| 8,572,426 B2 | 10/2013 | Chan et al. |
| 8,717,089 B1 | 5/2014 | Zhu et al. |
| 2004/0128090 A1 | 7/2004 | Read et al. |
| 2005/0076253 A1 | 4/2005 | Lu |
| 2005/0107967 A1 | 5/2005 | Patel et al. |
| 2005/0188230 A1 | 8/2005 | Bilak |
| 2009/0031155 A1 | 1/2009 | Hofmann et al. |
| 2010/0289553 A1 | 11/2010 | Wang |
| 2011/0004774 A1 | 1/2011 | Hansquine et al. |
| 2011/0080202 A1 | 4/2011 | Moore et al. |
| 2014/0312951 A1 | 10/2014 | Moore et al. |

FOREIGN PATENT DOCUMENTS

| | | |
|---|---|---|
| CN | 101069147 A | 11/2007 |
| GB | 2408116 | 5/2005 |
| JP | 2005149476 | 6/2005 |
| WO | 03062972 | 7/2003 |
| WO | 2005125012 A1 | 12/2005 |
| WO | 2006073845 | 7/2006 |
| WO | 2008141873 | 11/2008 |
| WO | 2009015326 A2 | 1/2009 |
| WO | 2010088155 | 8/2010 |

OTHER PUBLICATIONS

Das S, et al., "A Self-Tuning DVS Processor Using Delay-Error Detection and Correction" 2005 Symposium on VLSI Circuits Digest of Technical Papers. LNKDDO1 : 10.1109/VLS1C. 2005.1469380, Jun. 16, 2005, pp. 258-261, XP010818424 IEEE , Piscataway, NJ, USA ISBN: 978-4-900784-01-7.

Das S, et al,, "Razor II: In Situ Error Detection and Correction for PVT and SER Tolerance" IEEE Journal of Solid-State Circuits, LNKD—DOI : 10.1109/JSSC. 2008.2007145, vol. 44, No. 1, Dec. 30, 2008, pp. 32-48, XP011241059 IEEE Service Center, Piscataway, NJ, USA ISSN : 0018-9200 p. 32, right-hand column, line 3-line 5 p. 32, right-hand column, line 27-line 41 p. 42, left-hand column, last paragraph.

Das S., et al., "A Self-Tuning DVS Pocessor Using Delay-Error Detection and Correction", IEEE Journal of Solid-State Circuits, U.S.A., IEEE, Apr. 30, 2006, vol. 41, No. 4, pp. 792-804.

International Search Report and Written Opinion—PCT/US2010/029220, International Search Authority—European Patent Office—Jun. 10, 2010.

Lide Zhang, et al., "Scheduled voltage scaling for increasing life time in the presence of NBTI" Asia and South Pacific Design Automation Conference ASP-DAC 2009., Jan. 19, 2009, pp. 492-497, XP031434294 IEEE , Piscataway, NJ, USA ISBN: 978-1-4244-2748-2 p. 497, left-hand column, paragraph 2 p. 497, left-hand column, line 4.

Partial Internationai Search Report—PCT/US2010/029220—International Search Authority, European Patent Office, Jun. 22, 2010.

Seungyong Oh, et al., "Task partitioning algorithm for intra-task dynamic voltage scaling" Circuits and Systems, 2008. ISCAS 2008. IEEE International Symposium on, IEEE , Piscataway, NJ, USA LNKD—DOI : 10.1109/ISCAS.2008.4541646, May 18, 2008, pp. 1228-1231, XP031392201 ISBN: 978-1-4244-1683-7 p. 1231, paragraph 3.

AVS Frequency/Voltage Level Table (50)

| f | V | |
|---|---|---|
| 1 GHz | 1.32 | ← 52 |
| 800 MHz | 1.2 | |
| 600 MHz | 1.1 | |
| 400 MHz | 1.0 | |
| 200 MHz | 0.9 | |

FIG. 2

AVS Learned Values Table (90)

| f (96) | V (94) | Learned (92) |
|--------|--------|--------------|
| 1 GHz  | 1.2    | 1            |
| 800 MHz| 1.0    | 1            |
| 600 MHz| 0.9    | 1            |
| 400 MHz|        | 0            |
| 200 MHz| 0.85   | 1            |

| f | V |
|---|---|
| 1 GHz | 1.2 |
| 800 MHz | 1.0 |
| 600 MHz | ✗ P$_3$ |
| 400 MHz | 0.85 |
| 200 MHz | 0.8 |

| f | V |
|---|---|
| 1 GHz | |
| 800 MHz | |
| 600 MHz | P$_3$ - P$_1$ |
| 400 MHz | |
| 200 MHz | |

Minimum Voltage Level Limit
Table (190)

| f | V |
|---|---|
| 1 GHz | 0.85 |
| 800 MHz | 0.85 |
| 600 MHz | 0.95 |
| 400 MHz | 0.85 |
| 200 MHz | 0.85 |

FIG. 17

ADAPTIVE VOLTAGE SCALERS (AVSS), SYSTEMS, AND RELATED METHODS

PRIORITY APPLICATIONS

The present application is a divisional application of U.S. patent application Ser. No. 12/750,123 filed Mar. 30, 2010 and entitled "ADAPTIVE VOLTAGE SCALERS (AVSs), SYSTEMS, AND RELATED METHODS," which claims priority to and the benefit of U.S. Provisional Patent Application Ser. No. 61/164,882, filed Mar. 30, 2009, and U.S. Provisional Patent Application Ser. No. 61/222,779, filed Jul. 2, 2009, all of which are herein incorporated by reference in their entireties.

BACKGROUND

I. Field of the Disclosure

The technology of the present application relates to adaptive voltage scalers (AVSs) and related systems for controlling the voltage level powering a circuit at a given operating frequency.

II. Background

Synchronous digital circuits, such as central processing units (CPUs) or digital signal processors (DSPs) as examples, require a clock signal to coordinate timing of logic in the circuit. The frequency of the clock signal controls the switching speed or rate of the logic and thus the performance of the circuit. There is a relationship between operating frequency and the voltage level. An increase in operating frequency increases the minimum voltage level required to power the circuit for proper operation. Thus, an increase in operating frequency generally results in more power consumption. Power consumption can be decreased by lowering the voltage level powering the circuit. However, a decrease in voltage level decreases the maximum operating frequency possible for the circuit. The voltage level can be decreased until a minimum threshold voltage level for the circuit necessary for proper operation is reached.

While it is generally desired to maximize performance of a circuit by maximizing the operating frequency of a circuit, there may be times when maximizing the operating frequency is not required or desired. In this instance, the voltage level powering the circuit could be reduced to conserve power without affecting the proper operation of the circuit. In this regard, a dynamic voltage scaler (DVS) can be employed. The DVS can determine the desired operating frequency for the circuit and control a clock generator to produce a clock signal for the circuit at the desired operating frequency. The DVS can also use the determined operating frequency to determine a minimum voltage level for the circuit. The DVS can then control a voltage regulator to produce the desired minimum voltage level. In this manner, the DVS can adjust the voltage to a minimum voltage level at a given operating frequency to conserve power while maintaining proper circuit operation.

Other factors can raise the minimum voltage level required to power a circuit at a given operating frequency. For example, variability in nanometer integrated circuit (IC) processes used to manufacture synchronous digital circuits and their components can cause delay variations. Environmental conditions, such as operating temperature and aging effect of transistors, can affect propagation delay. Voltage levels supplied by voltage supplies can be momentarily lowered due to variations in current draw, thus momentarily lowering performance. In this regard, a DVS may be configured to control the minimum voltage level for the circuit according to worst case delay scenarios to ensure proper circuit operation, when in actuality, the worst case delay scenarios are not present at all times. When worst case delay scenarios are not present, the voltage level could be lowered and the circuit properly operates. The difference between the worst case minimum voltage level and the actual minimum voltage level required to power a circuit for a given operating frequency at a particular time is known as voltage or power margin. Voltage margin represents consumed power that ideally did not have to be consumed for a circuit to properly operate at a given operating frequency.

SUMMARY OF THE DISCLOSURE

Embodiments disclosed in the detailed description include adaptive voltage scalers (AVSs), AVS systems, and related circuits and methods. The AVSs and AVS systems, circuits, and methods are configured to adaptively adjust the voltage level powering a functional circuit(s) based on a target operating frequency and delay variation conditions for a functional circuit(s) to avoid or reduce voltage margin. Avoiding or reducing voltage margin can conserve power while maintaining proper operation of the functional circuit(s). Delay variations can include one or more manufacturing variations specific to each AVS and functional circuit(s) and/or operational variations caused by variations in environmental conditions. Delay variation conditions can shift the relationship between operating frequency and minimum voltage level necessary for proper operation of the functional circuit(s). The functional circuit(s) may be a synchronous digital circuit(s) as an example. The AVS may also be included as an additional voltage scaler to a dynamic voltage scaler (DVS) to set the operating frequency and voltage level for a functional circuit(s).

In one embodiment, the AVS comprises at least one delay circuit configured to receive an input signal. The AVS delays the input signal by a delay amount relating to at least one delay path of a functional circuit to produce a delay output signal. The AVS also comprises an AVS circuit coupled to an AVS database. The AVS circuit is responsive to the delay output signal. The AVS circuit is configured to generate a voltage level setting signal based on a voltage level in the database associated with an operating frequency for the functional circuit and delay information in the delay output signal. The AVS database can be configured to store voltage levels for various operating frequencies of a functional circuit(s) to avoid or reduce voltage margin.

In another embodiment, the AVS database can be configured to store learned voltage level settings previously been explored by the AVS for given operating frequencies of the functional circuit(s). In this manner, the AVS circuit can make rapid voltage level determinations after a new operating frequency for the functional circuit(s) is provided without having to wait for the new operating frequency to settle in the functional circuit(s). The AVS database can be configured to continue being updated with learned voltage levels. The AVS circuit may update the learned voltage levels in the AVS database. The AVS database may be configured with a minimum voltage level setting for all operating frequencies that cannot be breached. In this instance, a learned determined voltage level lower than the minimum voltage level setting for the functional circuit(s) to properly operate will not be used to set the voltage level.

The minimum voltage level settings in the AVS database may be configured to provide a voltage level with a tolerance voltage margin to avoid risking operating the functional circuit(s) in an invalid region of operation. However, in another embodiment, the AVS circuit is configured to explore the invalid region of operation of the functional circuit(s) during run-time operation to further avoid or reduce the tolerance voltage margin. In this embodiment, the AVS may comprise at least one delay circuit configured to receive an input signal and delay the input signal by an amount relating to at least one delay path of a functional circuit to produce a delay output signal. The AVS may also comprise an AVS circuit responsive to the delay output signal. The AVS circuit may be configured to generate a voltage level setting signal based on a target operating frequency for the functional circuit and delay information in the delay output signal. The AVS circuit may also be configured to increase the delay of the at least one delay path to simulate an increased operating frequency for the functional circuit to explore an invalid region of operation of the functional circuit. The point of transition to the invalid region of operation can be used by the AVS circuit to determine a revised voltage level setting for the current operating frequency to further avoid or reduce the tolerance voltage margin.

In another embodiment, the AVS circuit can be configured to accelerate population of the AVS database with voltage level settings for given operating frequencies. Once the AVS circuit learns a voltage level for a current operating frequency, the AVS circuit consults the voltage levels for lower operating frequencies in the AVS database. If the voltage levels stored for lower operating frequencies are greater than the learned voltage level for the current operating frequency, the AVS circuit can replace the voltage level for the lower operating frequencies with the learned lower voltage level in the AVS database. The functional circuit(s) is known to be able to properly operate at the learned voltage level for lower operating frequencies. In this manner, the AVS database is populated more quickly with lower voltage settings, if possible, so that voltage margin is more quickly avoided or reduced during operation.

In another embodiment, a temperature sensor is incorporated into the AVS to provide the current operating temperature level for the functional circuit(s). The operating temperature of the functional circuit(s) can shift the minimum voltage level setting for a given operating frequency of the functional circuit(s). The AVS circuit uses the operating temperature level to store and update voltage levels in the AVS database as a function of operating temperature level. The AVS circuit can also use the operating temperature level received from the temperature sensor to select a voltage level corresponding to the current operating frequency and operating temperature level during operation. In this manner, any shift in voltage level for a given operating frequency based on operating temperature can be taken into consideration to avoid or reduce voltage margin while also avoiding operating the functional circuit(s) in an invalid region of operation. The AVS circuit can store voltage levels as a function of operating temperature level in the AVS database. For example, the AVS database may contain a plurality of learned voltage level settings tables, each corresponding to a different operating temperature region.

In another embodiment, the AVS can be configured to learn when a voltage level caused the functional circuit(s) to operate in the invalid region of operation. In this embodiment, an AVS may be provided that comprises at least one delay circuit configured to receive an input signal and delay the input signal by an amount relating to at least one delay path of a functional circuit to produce a delay output signal. The AVS may include an AVS circuit responsive to the delay output signal and configured to generate a voltage level setting signal based on delay information in the delay output signal. The AVS circuit may be further configured to add a voltage margin to the voltage level setting signal if the voltage level caused the functional circuit to operate in an invalid region of operation. In this manner, the AVS circuit can be configured to "back out" the current voltage level setting in the AVS database by increasing the voltage level setting for the current operating frequency.

In another embodiment, the AVS may be configured to compensate voltage levels for negative bias temperature instability (NBTI). In this embodiment, the AVS may comprise at least one delay circuit configured to receive an input signal and delay the input signal by an amount relating to at least one delay path of a functional circuit to produce a delay output signal. The AVS may also comprise an AVS circuit responsive to the delay output signal and configured to generate a voltage level setting signal based on delay information in the delay output signal and a voltage level correction based on an aging indicator of the functional circuit. In this manner, the AVS can be configured to compensate for NBTI by raising the minimum voltage level for operating frequencies over time. The AVS may be configured to raise the minimum voltage levels over time in the AVS database. The AVS can then be configured to enforce the compensated minimum voltage level setting if the determined voltage level for any operating frequencies is below the minimum, compensated voltage level. The learned voltage levels may be updated with the compensated voltage level in the AVS database.

In another embodiment, a method of scaling a voltage level for a functional circuit is provided. The method comprises receiving an input signal in at least one delay circuit. The method further comprises delaying the input signal by a delay amount relating to at least one delay path of a functional circuit to produce a delay output signal, and generating a voltage level setting signal based on a voltage level in a database associated with a target operating frequency for the functional circuit and delay information in the delay output signal.

In another embodiment, a computer readable medium having stored thereon computer executable instructions is provided. The instructions are provided to cause an AVS module to generate a voltage level setting signal based on a voltage level in a database associated with a target operation frequency for a functional circuit and delay information in a delay output signal representing a delay amount relating to at least one delay path of the functional circuit.

BRIEF DESCRIPTION OF THE FIGURES

FIG. 2 is an exemplary AVS frequency/voltage level table stored in an AVS database;

FIG. 7 is an exemplary AVS learned values table that may be included in an AVS database to store learned voltage levels for explored operating frequencies;

FIG. 11 is an exemplary AVS frequency/voltage level table stored in an AVS database;

FIG. 12 is an exemplary voltage level difference table stored in an AVS database;

FIG. 17 is an exemplary minimum voltage level limit table stored in an AVS database corresponding to different operating frequencies;

DETAILED DESCRIPTION

Figure 1:
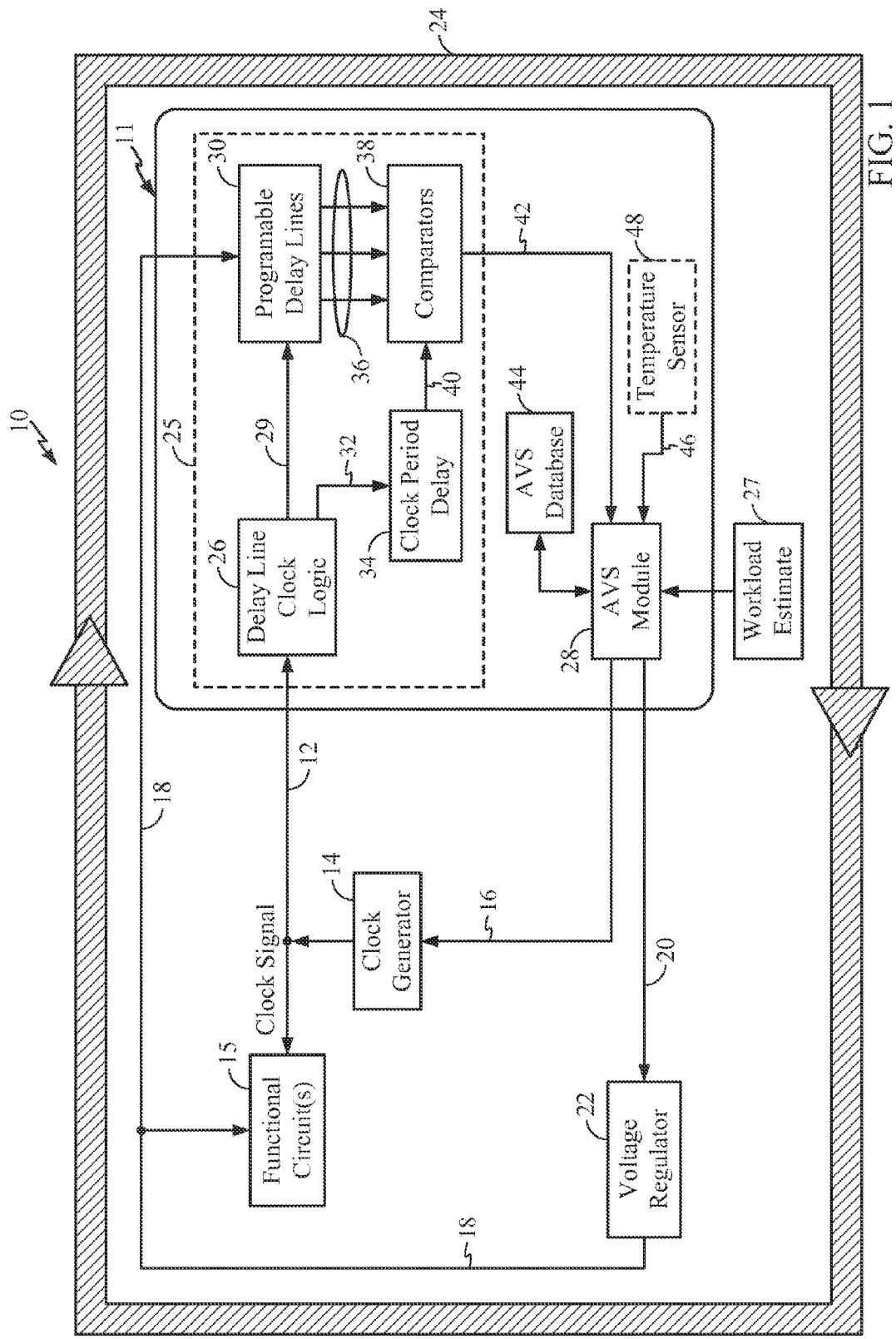
FIG. 1 is a schematic diagram of an exemplary adaptive voltage scaler (AVS), AVS system and functional circuit(s)

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include adaptive voltage scalers (AVSs), AVS systems, and related circuits and methods. The AVSs and AVS systems, circuits, and methods are configured to adaptively adjust the voltage level powering a functional circuit(s) based on a target or desired operating frequency and delay variation conditions for a functional circuit(s) to avoid or reduce voltage margin. Avoiding or reducing voltage margin can conserve power while maintaining proper functional circuit(s) operation. Delay variations can include one or more manufacturing variations specific to each AVS and functional circuit(s) and/or operational variations caused by variations in environmental conditions. Delay variation conditions can shift the relationship between operating frequency and minimum voltage level necessary for proper operation of the functional circuit(s). The functional circuit(s) may be a synchronous digital circuit(s) as an example. The AVS may also be included as an additional voltage scaler to a dynamic voltage scaler (DVS) to set the operating frequency and voltage level for a functional circuit(s).

In this regard, an exemplary adaptive voltage scaler (AVS) system 10 is schematically illustrated in FIG. 1. The AVS system 10 includes an AVS 11 that is configured to determine and set an operating frequency of a clock signal 12 generated by a clock generator 14 for controlling the switching speed or rate of the logic in a functional circuit(s) 15. The functional circuit(s) 15 may be a synchronous digital circuit, as an example. The AVS 11 generates an operating frequency setting signal 16 as an input into the clock generator 14 to control the operating frequency of the clock signal 12. The clock generator 14 may provide a conventional clock signal, a glitch free clock signal, or any other type of clock signal desired.

The AVS 11 also controls a voltage level of a voltage signal 18 provided to the functional circuit(s) 15 to power the functional circuit(s) 15. The AVS 11 generates a voltage level setting signal 20 as an input into a voltage regulator 22 to control the voltage level of the voltage signal 18. The voltage level is determined based on the operating frequency determined by the AVS 11 and delay variation conditions. There is a relationship between the operating frequency of the functional circuit(s) 15 and the minimum voltage level to power the functional circuit(s) 15 for proper operation. An increase in operating frequency increases the minimum voltage level to power the functional circuit(s) 15 for proper operation. A decrease in operating frequency decreases the minimum voltage level to power the functional circuit(s) 15 for proper operation, at least until a minimum threshold voltage necessary to power the functional circuit(s) 15 is reached.

With continuing reference to FIG. 1, the AVS 11 adaptively determines the operating frequency and voltage level for the functional circuit(s) 15 repeatedly over time, either periodically or a periodically, in a tuning loop 24. The operating frequency setting signal 16 is adaptively controlled to avoid or reduce performance margin of the functional circuit(s) 15 while not exceeding performance capabilities. The voltage level setting signal 20 is also adaptively controlled to avoid or reduce voltage margin to conserve power for the functional circuit(s) 15 while maintaining the target operating frequency. The voltage signal 18 is produced by the voltage regulator 22 according to the voltage level setting signal 20 generated by an AVS module 28 in the AVS 11. The AVS module 28 is a circuit. The AVS 11 generates the operating frequency setting signal 16 and voltage level setting signal 20 in response to workload estimate 27.

One or more delay circuits 25 are provided in the AVS 11 to produce a delay based on delay variation conditions provided in the functional circuit(s) 15. Delays in the functional circuit(s) 15 can vary due to variations in the manufacturing process and/or operating conditions. The delay circuit 25 includes delay line clock logic 26 that receives as an input signal the clock signal 12 generated by the clock generator 14 as part of the tuning loop 24. The delay line clock logic 26 generates an output signal 29 representing a delay of the clock signal 12 into delay lines 30 and an output signal 32 representing a delay of the clock signal 12 into a clock period delay 34. The delay lines 30 have a plurality of delay paths (not shown) configured to correspond to one or more selected delay paths in the functional circuit(s) 15. The selected delay paths have associated delays that are configured to simulate and adjust in the same or similar manner to selected delay paths in the functional circuit(s) 15 based on delay variation conditions during operation. For example, the delay paths may include gate-dominated, wire-dominated, and/or diffusion capacitance-dominated delay paths, wherein one of the delay paths will produce the greater delay depending on present operating conditions of the functional circuit(s) 15. The selected delay paths may also correspond to one or more critical paths in the functional circuit(s) 15. The delay lines 30 may be programmable to allow the selected delay paths therein to be tuned to the specific functional circuit(s) 15 coupled to the AVS 11.

The delay lines 30 in the delay circuit 25 generate delay line outputs 36 that are input into comparators 38 in this embodiment. The comparators 38 may be comparison flip-flops, as an example. The comparators 38 generate a delay output signal 42 upon receipt of a clock period delay signal 40 from the clock period delay 34. The delay output signal 42 is received from the delay circuit 25 as an input into the AVS module 28. The delay output signal 42 represents selection of the longest delay path in the delay lines 30 and thus the delay or timing margin in the functional circuit(s) 15. The AVS module 28 uses the timing margin information to estimate the next operating frequency to maintain proper functional circuit(s) 15 operation while avoiding or reducing voltage margin. The AVS module 28 selects the next operating frequency of the functional circuit(s) 15. More specifically, the AVS module 28 generates the operating frequency setting signal 16 to control the clock generator 14 to change the clock signal 12 according to the next operating frequency. In this embodiment, the AVS module 28 is a software-controlled processor or controller. However, the AVS module 28 could also be provided by discrete logic without a processor or software or partially controllable by software executing in a circuit.

The AVS module 28 next determines a new voltage level for powering the functional circuit(s) 15 based on a new operating frequency request. The new voltage level is a safe minimum voltage level for the operating frequency to properly operate the functional circuit(s) 15 while also avoiding or reducing voltage margin. The AVS module 28 may adjust the voltage level based on delay variation conditions that can shift the relationship between operating frequency and voltage level in the functional circuit(s) 15. Various embodiments are disclosed herein that illustrate examples of the AVS module 28 determining the new voltage level for the new operating frequency. Once the AVS module 28 determines the new voltage level for the new operating frequency, the AVS module 28 applies the new voltage level. The AVS module 28 generates the voltage level setting signal 20 to provide the new voltage level to the voltage regulator 22. The voltage regulator 22 generates the voltage signal 18 at the new voltage level to power the functional circuit(s) 15. The clock signal 12 and the voltage signal 18 are also inputs into the AVS 11 during a next iteration of the tuning loop 24 to provide adaptive control of the voltage level of the functional circuit(s) 15 based on operating frequency and delay variation conditions in the functional circuit(s) 15.

The AVS module 28 may additionally use an operating temperature level signal 46 received from a temperature sensor 48 optionally included in the AVS 11 to further adjust the voltage level for the next operating frequency. Temperature level can shift the minimum voltage level for maintaining proper functional circuit(s) 15 operation at a given operating frequency. More information regarding the use of an operating temperature level by the AVS 11 to determine the next voltage level setting will be described later in this application.

As discussed above, the AVS module 28 determines a new voltage level for powering the functional circuit(s) 15 for a given new, determined operating frequency. One example of the AVS module 28 determining the new voltage level is provided in the AVS frequency/voltage level table 50 in FIG. 2. The AVS frequency/voltage level table 50 may be stored in an AVS database 44 and accessed by the AVS module 28 for determining the new voltage level. The AVS module 28 may also update learned voltage levels in the AVS frequency/voltage level table 50, as will be described herein. The AVS module 28 may be a software-controlled module or processor that executes software instructions to access voltage levels in the AVS frequency/voltage level table 50 to determine the next voltage level. Alternatively, the AVS module 28 may be partially controllable by software executed by the AVS module 28. The AVS module 28 may also execute software instructions to determine the next operating frequency and voltage level. Providing the AVS module 28 as a software-based module allows parameters and algorithms contained therein for determining operating frequency and voltage levels as well as information stored in the AVS database 44 to be easily configured or re-configured after the AVS 11 and the functional circuit(s) 15 are designed and/or manufactured. However, the AVS module 28 could also be provided in electrical circuits without the use of software-based modules or devices.

The AVS frequency/voltage level table 50 in FIG. 2 represents a safe, preselected minimum voltage level for the functional circuit(s) 15 for various given operating frequencies to avoid or reduce voltage margin while maintaining proper functional circuit(s) 15 operation. Thus, the AVS frequency/voltage level table 50 is specific to the functional circuit(s) 15. The AVS frequency/voltage level table 50 in this embodiment contains a finite number of operating frequency and voltage level pairs 52. For example, as illustrated in FIG. 2, the minimum voltage level stored in the AVS frequency/voltage level table 50 for a 1.0 GigaHertz (GHz) operating frequency is 1.32 Volts (V). The minimum voltage level lowers as the operating frequency lowers. The AVS frequency/voltage level table 50 could be designed to contain any number of operating frequency and voltage level pairs desired in the AVS database 44. Voltage levels for operating frequency points not contained in the AVS frequency/voltage level table 50 can be interpolated by the AVS module 28 in this embodiment. If it is not desired to assume linearity, the AVS module 28 could set the voltage level for an operating frequency not contained in the AVS frequency/voltage level table 50 to the voltage level of the next highest operating frequency contained in the AVS frequency/voltage level table 50.

On reset of the AVS 11, the tuning loop 24 has not yet iterated to allow the AVS module 28 to adaptively determine the voltage level. Thus, in one embodiment, the AVS frequency/voltage level table 50 can be initialized with known, safe voltage levels for each operating frequency point contained therein until adaptive voltage levels are learned. Alternatively, the AVS frequency/voltage level table 50 could initially register all operating frequency points contained therein as being uninitialized. The AVS module 28 could populate the voltage levels in the AVS frequency/voltage level table 50 as each new operating frequency contained therein is explored by the AVS module 28 and a new voltage level is determined for the new operating frequency.

Although the AVS frequency/voltage level table 50 in FIG. 2 contains a finite number of operating frequency and voltage level pairs 52, this representation is simply a function of digital storage of points along an operating frequency versus voltage level characteristic curve of the functional circuit(s)

Figure 3:
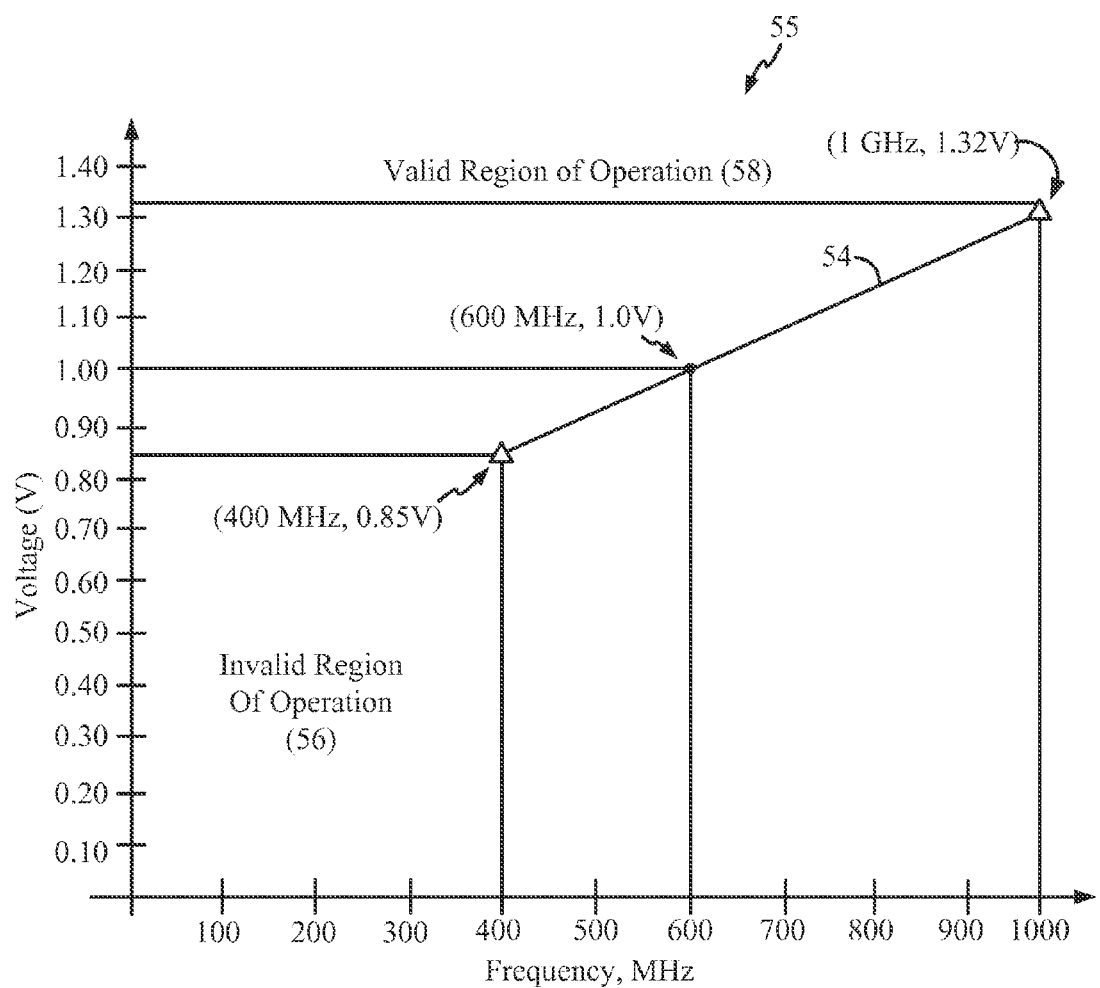
FIG. 3 is an exemplary operating frequency versus voltage level diagram illustrating regions of operation of a functional circuit(s)

15. In FIG. 3, an example of an exemplary operating frequency, voltage level characteristic curve 54 (also referred to herein as "characteristic curve 54") for the functional circuit(s) 15 is illustrated in an operating frequency versus voltage level diagram 55 provided therein. The characteristic curve 54 represents the minimum voltage level required by the functional circuit(s) 15 for a given operating frequency over the range of possible operating frequencies. Any operating frequency, voltage level point below the characteristic curve 54 is in an invalid region of operation 56 for the functional circuit(s) 15. Any operating frequency, voltage level point on or above the characteristic curve 54 is in a valid region of operation 58 for the functional circuit(s) 15. Note that the characteristic curve 54 also illustrates the minimum operating voltage to properly operate the functional circuit(s) 15 regardless of the operating frequency, which is 0.85 V in the example of FIG. 3.

As an alternative to the AVS frequency/voltage level table 50, the operating frequency and voltage level pairs 52 could be determined by a polynomial provided in the AVS database 44 or AVS module 28 that approximates the characteristic curve 54. The characteristic curve 54 could also be represented by multiple polynomials, each representing a subrange of operating frequencies in the characteristic curve 54, which may allow lower-order polynomials to be used to represent the characteristic curve 54.

Although the operating frequency, voltage level characteristic curve 54 represents the ideal minimum voltage levels for operating frequencies of the functional circuit(s) 15 in this example, delay variation conditions can shift the characteristic curve 54 from ideal conditions. Delay variation conditions can be any conditions that can change delay in a given delay path in a functional circuit. For example, delay variation conditions can include process variations across individual integrated circuits (ICs) resulting during manufacture of the ICs. Environmental conditions, such as operating temperature and aging effect of transistors, can also affect propagation delay in the functional circuit(s) 15. Voltage levels supplied by voltage supplies can be momentarily lowered due to variations in current draw, thus momentarily lowering performance of the functional circuit(s) 15. Thus, the AVS 11 can include a number of additional features and devices according to other embodiments to provide additional benefits and performance to further adaptively optimize the avoidance or reduction of voltage margin while maintaining proper functional circuit(s) 15 operation. These additional features and device embodiments will now be described.

In one embodiment, the AVS database 44 can be utilized to store learned, optimal voltage level settings that have already been explored by the AVS 11 for a given operating frequency or frequencies. In this manner, the AVS module 28 can generate the voltage level setting signal 20 to return the functional circuit(s) 15 to a specific, optimal voltage level setting rapidly for new operating frequencies that have been previously explored without having to wait for the new operating frequency to settle. Any additional voltage margin present between the time of the setting of the new operating frequency by the AVS module 28 and the settling of the new operating frequency can be avoided or reduced to further conserve total power consumption by the functional circuit(s) 15.

Figure 4:
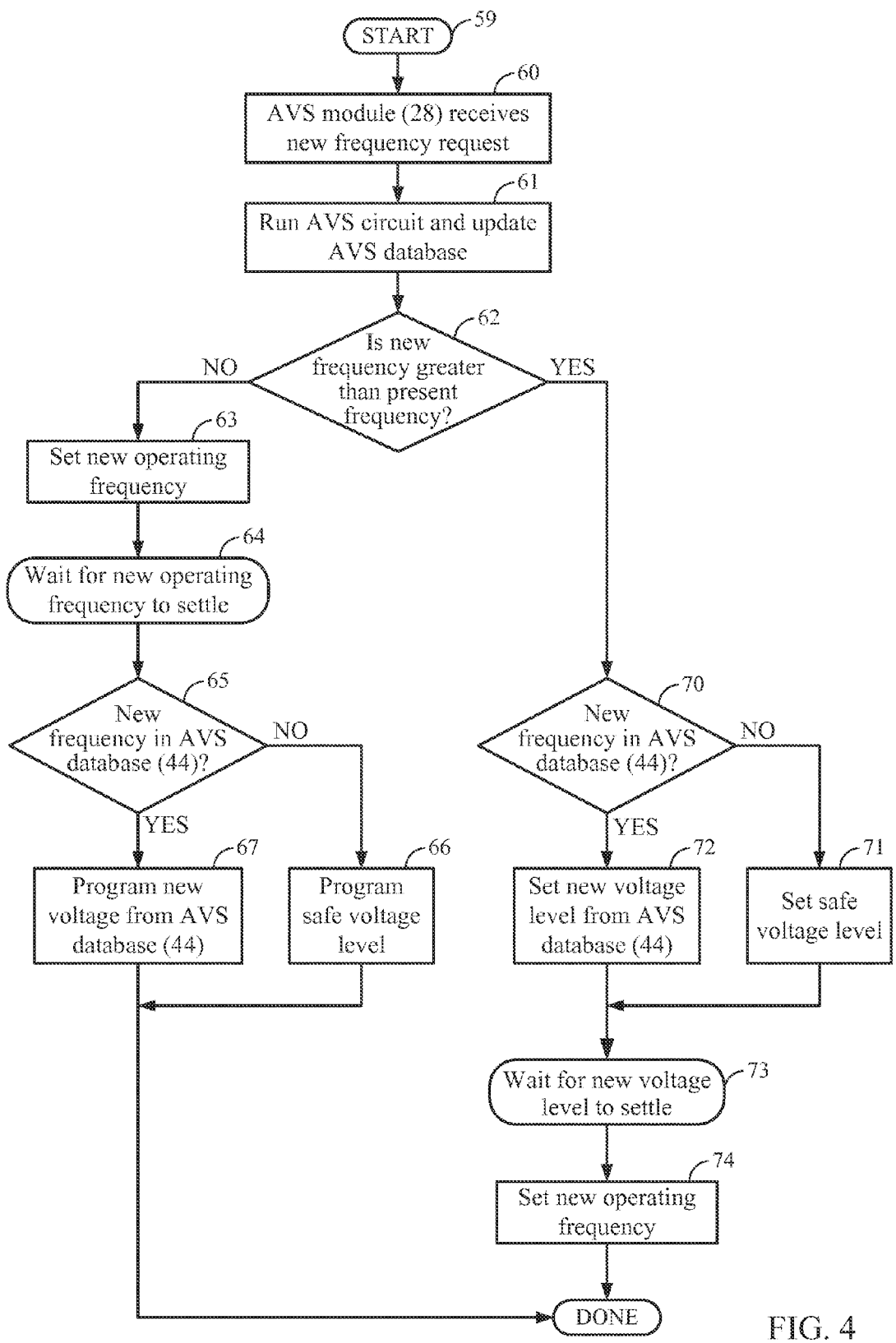
FIG. 4 is a flowchart providing an exemplary process for utilizing an AVS database to adaptively store and use learned voltage levels for setting the voltage level of the functional circuit(s) based on operating frequency to avoid or reduce voltage margin.

In this regard, FIG. 4 provides a flowchart of an exemplary process that can be performed by the AVS module 28 in the AVS 11 to adaptively determine and set the operating frequency and voltage level for the functional circuit(s) 15 based on stored, learned voltage level settings stored in the AVS database 44. The process in FIG. 4 is executed by the AVS module 28 as part of the tuning loop 24 in this embodiment. The process starts (block 59) by the AVS module 28 receiving a new operating frequency request for the functional circuit(s) 15 (block 60). The AVS module 28 receives the new operating frequency request as the workload estimate 27, as illustrated in FIG. 1. In this embodiment, the AVS module 28 next determines the voltage level for the current operating voltage and updates the AVS database 44 accordingly, as will be described in greater detail below, before setting a new operating frequency and voltage level (step 61). Alternatively, the AVS module 28 could be configured to execute and update the AVS database 44 after a new operating frequency and voltage level for the functional circuit(s) 15 have been set. Other features and functions may be performed by the AVS module 28 as will also be described in more detail below. The AVS module 28 then determines if the new operating frequency is greater than the current operating frequency (block 62). If the new operating frequency is not greater than the current operating frequency, the AVS module 28 can go forward immediately with setting the operating frequency setting signal 16 for the new operating frequency without having to determine if the voltage level for the functional circuit(s) 15 should be adjusted (block 63). The functional circuit(s) 15 is known to be able to properly operate at a lower operating frequency for the current voltage level setting. However, it is still desired to reduce the current voltage level if possible to avoid or reduce voltage margin. In this regard, the AVS module 28 waits for the new operating frequency to settle in the functional circuit(s) 15 (block 64) to determine a new voltage level for the functional circuit(s) 15. This may take several clock cycles and iterations of the tuning loop 24.

Once the new operating frequency has settled, the AVS module 28 determines if the new operating frequency has been previously explored by the AVS module 28 in the AVS database 44 (block 65). If not, the AVS module 28 programs the voltage level to a known safe voltage level for the new operating frequency (block 66). The safe voltage level may be based on a DVS setting. If the new operating frequency has been previously explored by the AVS module 28 in the AVS database 44 (block 65), the AVS module 28 sets the voltage level setting signal 20 to the new voltage level for the functional circuit(s) 15 based on the learned voltage level stored in the AVS database 44 (block 67). As discussed in more detail below, the AVS module 28 is configured to store learned voltage levels corresponding to explored operating frequencies in the AVS database 44 to avoid or reduce voltage margin based on variation and operation conditions of the functional circuit(s) 15. The learned voltage level will typically be lower than the safe voltage level thus reducing energy consumption by the functional circuit(s) 15. Thus, the voltage level can be lowered more rapidly in the functional circuit(s) 15 than it would otherwise be by use of the AVS database 44 to store learned voltage levels. This is illustrated by example in FIGS. 5 and 6, discussed below.

Figure 5:
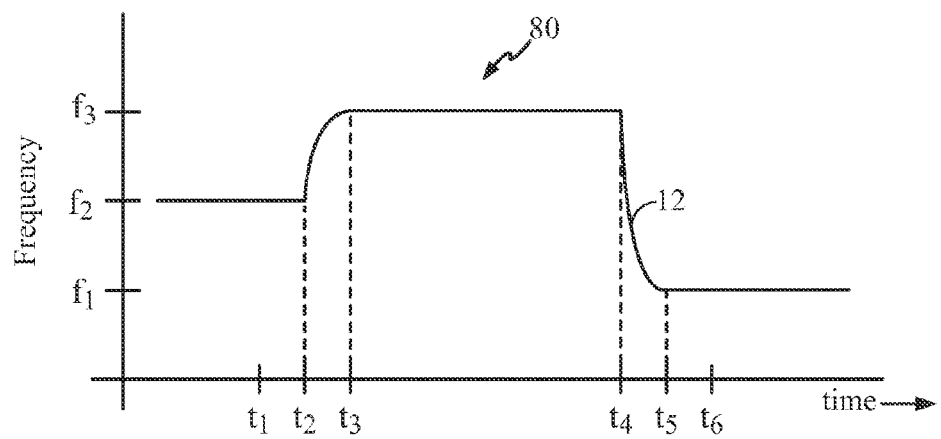
FIG. 5 is an exemplary operating frequency timing diagram of a clock signal generated by a clock generator under control of the AVS in FIG. 1.
Figure 6A:
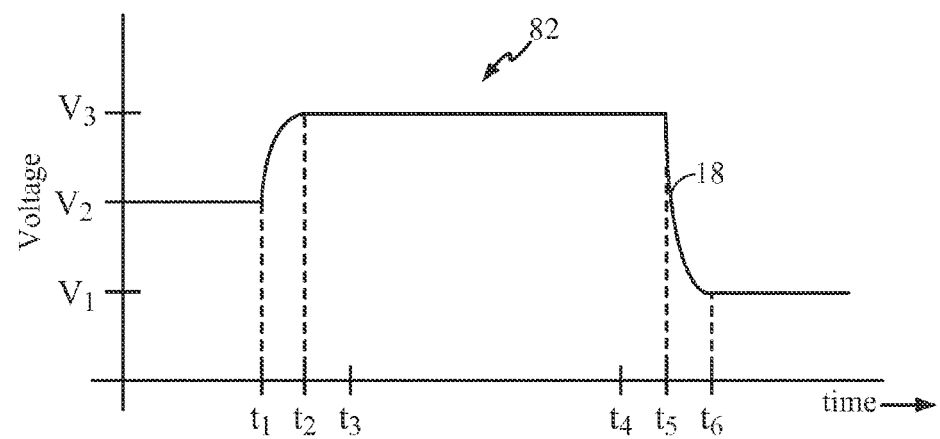
FIG. 6A is a exemplary voltage level timing diagram of the voltage signal generated by a voltage regulator under control of the AVS in FIG. 1.
Figure 6B:
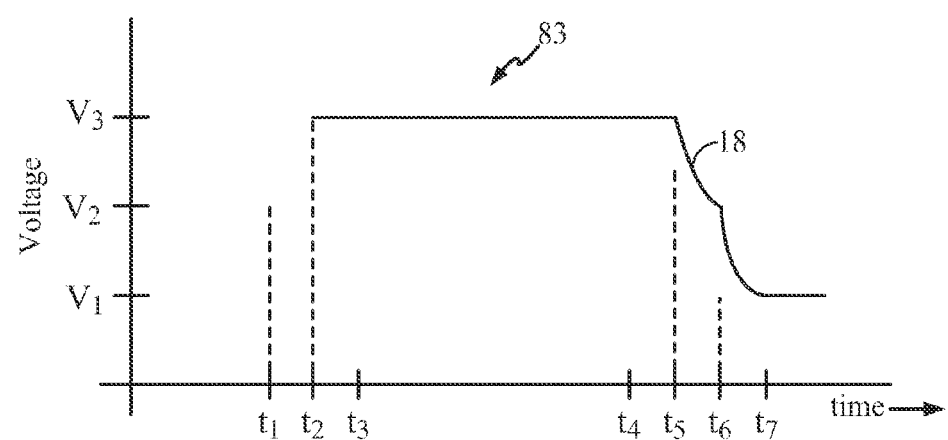
FIG. 6B is a exemplary voltage level timing diagram of a voltage signal if a new voltage level could not be set by the AVS without having to wait for a new operating frequency to settle.

FIG. 5 illustrates an exemplary operating frequency timing diagram 80 of the clock signal 12 generated by the clock generator 14 under the control of the AVS 11 in FIG. 1. FIG. 6A illustrates a corresponding exemplary voltage level timing diagram 82 of the voltage signal 18 generated by the voltage regulator 22, also under the control of the AVS 11 in FIG. 1. As illustrated in FIG. 5, the clock signal 12 is at operating frequency $f_3$ from time $t_3$ to time $t_4$. At time $t_4$, the AVS module 28 has set the new operating frequency for the clock generator 14 to $f_1$ (see, e.g., FIG. 4, block 63). The operating frequency of the clock signal 12 starts to drop from $f_3$ to $f_1$ between times $t_4$ and $t_5$ and stabilizes at frequency $f_1$ at time $t_5$. Once the AVS module 28 has determined that the new operating frequency has settled in the functional circuit(s) 15 (see, e.g., FIG. 4, block 64), the AVS module 28 consults the AVS database 44. The AVS module 28 consults the AVS database 44 to determine if a voltage level for the new operating frequency $f_1$ has previously been explored and learned (see, e.g., FIG. 4, block 65). In this example, the AVS database 44 contained a previously explored and learned voltage level for the new operating frequency $f_1$ (see, e.g., FIG. 4, block 67). Thus, as illustrated in the voltage level timing diagram 82 in FIG. 6A, the AVS module 28 was able to set the voltage level setting signal 20 to the new and previously learned voltage level one clock cycle without having to wait for the new operating frequency to settle. Otherwise, the AVS module 28 would not be able to set the voltage level setting signal 20 to the new voltage level in one clock cycle as illustrated in the voltage level timing diagram 83 of FIG. 6B. The process continues by returning back to the start (block 59) to repeat the steps in FIG. 4 in a looping fashion each time the AVS module 28 receives a new operating frequency request.

If the new operating frequency is greater than the current operating frequency (block 62), as illustrated by example at time $t_1$ in the voltage level timing diagram 82 of FIG. 6A, the AVS module 28 does not immediately set the operating frequency setting signal 16 to the new operating frequency. This is illustrated by example at time $t_1$ in the operating frequency timing diagram 80 of FIG. 5. This is because the AVS module 28 determines a new voltage level first to ensure the functional circuit(s) 15 properly operates before setting the new operating frequency. In this regard, the AVS module 28 determines if the new operating frequency has been previously explored by the AVS module 28 in the AVS database 44 (block 70). If not, the AVS module 28 programs the voltage level to a known safe voltage level for the new operating frequency (block 71). The safe voltage level may be based on a DVS setting. If the new operating frequency has been previously explored by the AVS module 28 in the AVS database 44 (block 70), the AVS module 28 sets the voltage level setting signal 20 to the new voltage level for the functional circuit(s) 15 based on the learned voltage level stored in the AVS database 44 (block 72). Again, the AVS module 28 is configured to store learned voltage levels corresponding to explored operating frequencies in the AVS database 44 to more rapidly lower the voltage level to avoid or reduce voltage margin based on variation and operation conditions of the functional circuit(s) 15. The learned voltage level will typically be lower than the safe voltage level thus reducing energy consumption by the functional circuit(s) 15. Thereafter, the AVS module 28 waits for the new voltage level to settle in the functional circuit(s) 15 (block 73) (e.g., $t_1$-$t_2$). Additional frequency margin may be present while the AVS module 28 waits for the new voltage level to settle before the new operating frequency can be set. After the new voltage level has settled, the AVS module 28 can safely adjust the new operating frequency for the functional circuit(s) 15 to the higher operating frequency (block 74) (e.g., $t_1$-$t_3$). The process continues by returning back to the start (block 59) to repeat the steps in FIG. 4 in a looping fashion each time the AVS module 28 receives a new operating frequency request.

FIG. 7 illustrates an example of an AVS learned values table 90 that may be stored and maintained in the AVS database 44 as part of the AVS 11 learning voltage levels for previously explored operating frequencies. The AVS module 28 in the AVS 11 can consult the AVS learned values table 90 to determine if a voltage level has previously been explored and learned for a particular operating frequency as previously discussed (see, e.g., FIG. 4, blocks 65 and 70). The AVS module 28 may update the AVS learned values table 90 as part of an updating process of the AVS database 44 (e.g., FIG. 4, block 69). In this embodiment, as illustrated in FIG. 7, the AVS learned values table 90 is similar to the AVS frequency/voltage level table 50 in FIG. 2. However, the AVS learned values table 90 contains a learned column 92 that indicates whether the corresponding voltage level stored in a voltage level column 94 was previously explored and learned for the corresponding operating frequency in an operation frequency column 96. For example, the learned column 92 could be configured to store an indicator of whether the value stored in the voltage level column 94 is a valid previously explored and learned voltage level or contains an initial or invalid data. For example, the indicator could be a validity bit 98 as illustrated in FIG. 7. A logical "1" could represent a valid value, and a logical "0" could represent an invalid value, or vice versa. As illustrated in FIG. 7, each of the operation frequencies except 400 MHz contains previously learned voltage levels.

The AVS module 28 can continue to update the AVS learned values table 90 in the AVS database 44 with learned voltage level settings. As previously discussed, the AVS module 28 may be configured with a minimum voltage level setting for all operating frequencies of the functional circuit(s) 15 that cannot be breached. In this instance, the AVS module 28 may be configured to not store a learned voltage level setting in the AVS database 44 lower than the minimum voltage level setting for all operating frequencies of the functional circuit(s) 15.

In this example, certain voltage levels stored in the AVS learned values table 90 of FIG. 7 are lower than corresponding voltage levels in the AVS frequency/voltage level table 50 in FIG. 2. This may be due to the AVS 11 accounting of additional delay variations determined by the AVS module 28 in the relationship between voltage levels and operating frequencies in the functional circuit(s) 15. The AVS module 28 may be configured to populate the voltage levels in the AVS learned values table 90 initially with safe voltage levels for the functional circuit(s), such as the voltage levels in the AVS frequency/voltage level table 50 of FIG. 2, until the AVS module 28 adaptively learns other voltage levels based on delay variation conditions. Typically, the learned voltage levels will be lower in voltage level than the initial voltage levels since the purpose of the AVS 11 is to reduce voltage margin based on operational parameters and delay conditions in the functional circuit(s) 15.

Figure 8:
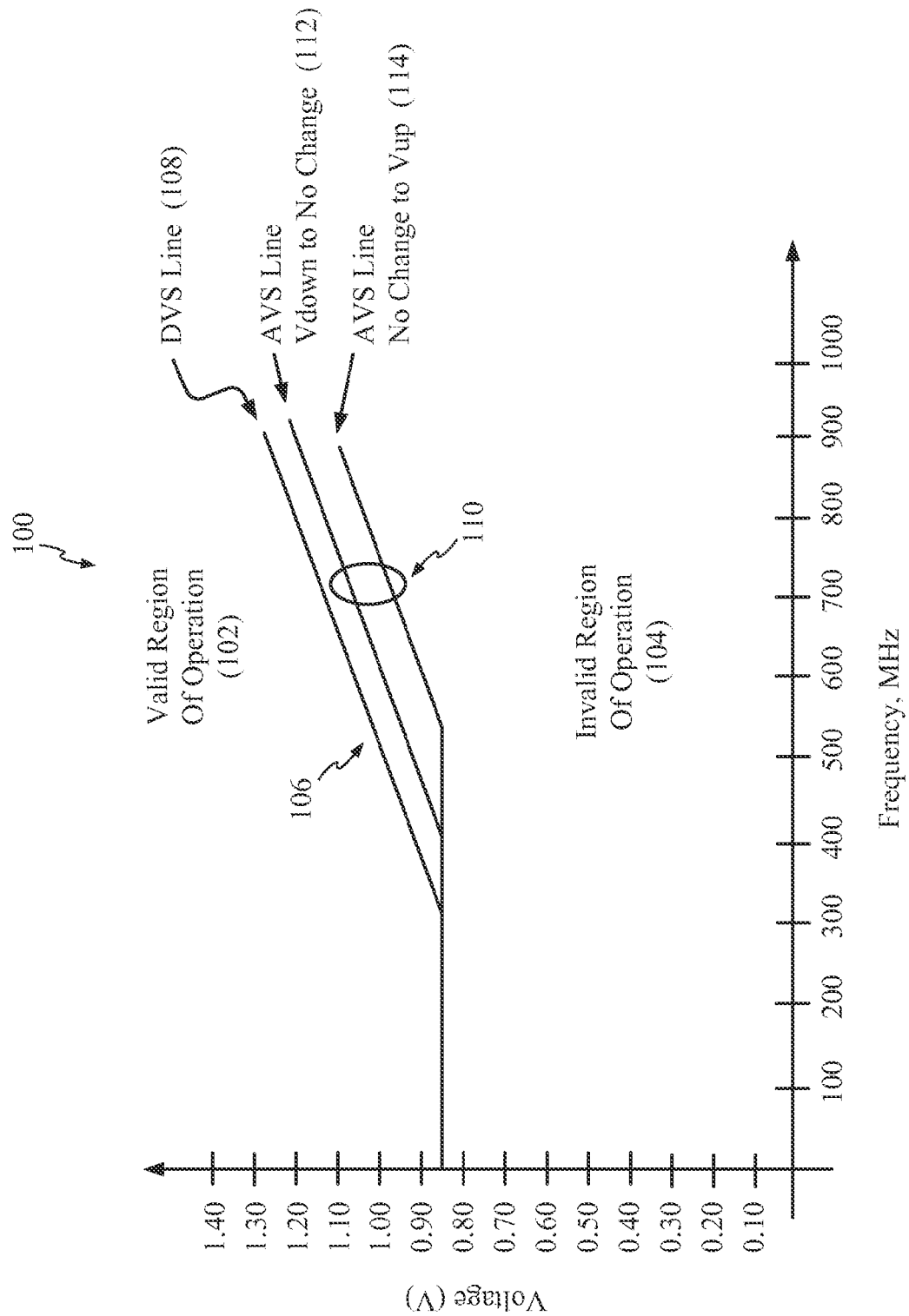
FIG. 8 is an exemplary operating frequency versus voltage level diagram illustrating different regions of operation for a functional circuit(s)

In another embodiment, the AVS 11 is configured to explore the invalid region of operation of the functional circuit(s) 15 during run-time to further avoid or reduce voltage margin. Before discussing embodiments of exploring the invalid region of operation of the functional circuit(s) 15, an exemplary operating frequency versus voltage diagram 100 in FIG. 8 is first described. As illustrated in FIG. 8, the functional circuit(s) 15 has two regions of operation; a valid region of operation 102 and an invalid region of operation 104. A set of characteristic curves 106 of the functional circuit(s) 15 is a line formed by the operating frequency and minimum voltage level value pairs in the valid region of operation 102. The characteristic curve 106 separates the valid region of operation 102 from the invalid region of operation 104. There is a minimum voltage level for proper operation of the functional circuit(s) 15 regardless of the operating frequency, which is illustrated by example as 0.85 V in the operating frequency versus voltage diagram 100 in FIG. 8. Above a defined operating frequency, the minimum voltage level must be increased maintain proper functional circuit(s) 15 operation in the valid region of operation 102.

A dynamic voltage scaler (DVS) line 108 indicates the lower bound of operation of the functional circuit(s) 15 should a DVS be employed to control the voltage level in the functional circuit(s) 15. The DVS line 108 provides the minimum voltage level for the valid region of operation 102 across all acceptable variations in processes and operating conditions in the functional circuit(s) 15. AVS lines 110 illustrate bounds of operation of the functional circuit(s) 15 lower than the DVS line 108. The AVS lines 110 represent a reduction in voltage margin due to the AVS 11 taking into consideration delay variations in processes and operating conditions in the functional circuit(s) 15 when determining and setting the voltage level in the functional circuit(s) 15. There are two AVS lines 112, 114 in the operating frequency versus voltage level diagram 100 in FIG. 8 that represent three possible decisions from the AVS 11 in FIG. 1. This is due to the comparators 38 including comparison flip-flops that may have some built-in hysteresis. The three possible decisions are as follows:

"Vdown" condition, meaning the current voltage level is higher than necessary for proper functional circuit(s) 15 operation;

"No change" condition, meaning the current voltage level is adequate for proper functional circuit(s) 15 operation; and "Vup" condition, meaning the current voltage level is lower than necessary for proper functional circuit(s) 15 operation.

The desirable point at which to operate the functional circuit(s) 15 from a power consumption perspective is the AVS line 114 that defines the transition from the region of operation from "No Change" to "Vup." On this AVS line 114, the minimum voltage level possible for maintaining proper operation of the functional circuit(s) 15 is provided. However, little or no voltage margin tolerance is provided on the AVS line 114. If the AVS line 114 was used by the AVS module 28 to control the voltage level, a "Vup" condition could occur indicating invalid operation for the functional circuit(s) 15 due to the timing delay associated with the AVS 11 measuring the operating frequency of the clock signal 12. As a result, the AVS module 28 may set the voltage level in the invalid region of operation 104 during certain periods of time. A "Vup" condition may cause the AVS 11 and functional circuit(s) 15 to reset. Thus, in one embodiment of the AVS 11, the AVS line 112 is used to determine the voltage level for a given operating frequency. The AVS line 112 reduces voltage margin over the DVS line 108, but includes voltage margin tolerance over the AVS line 114 to avoid operating the functional circuit(s) 15 in the invalid region of operation 104. Embodiments further described herein further reduce voltage margin from the AVS line 112 to zero voltage margin on the AVS line 114 or as close to zero voltage margin as possible.

Figure 9:
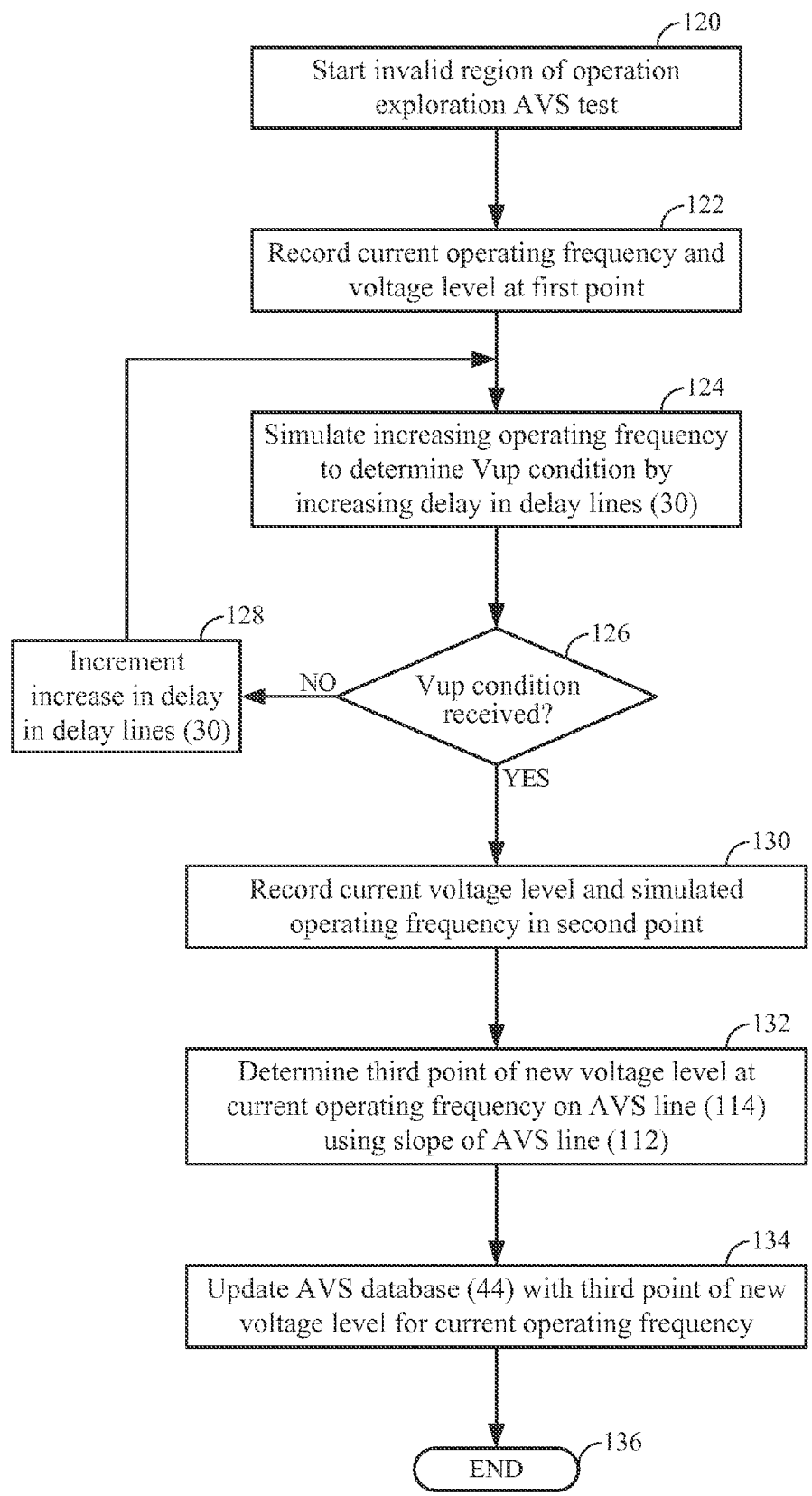
FIG. 9 is a flowchart providing an exemplary process for exploring the invalid region of operation of a functional circuit(s) at a given operating frequency and storing a revised voltage level based on such exploration.
Figure 10:
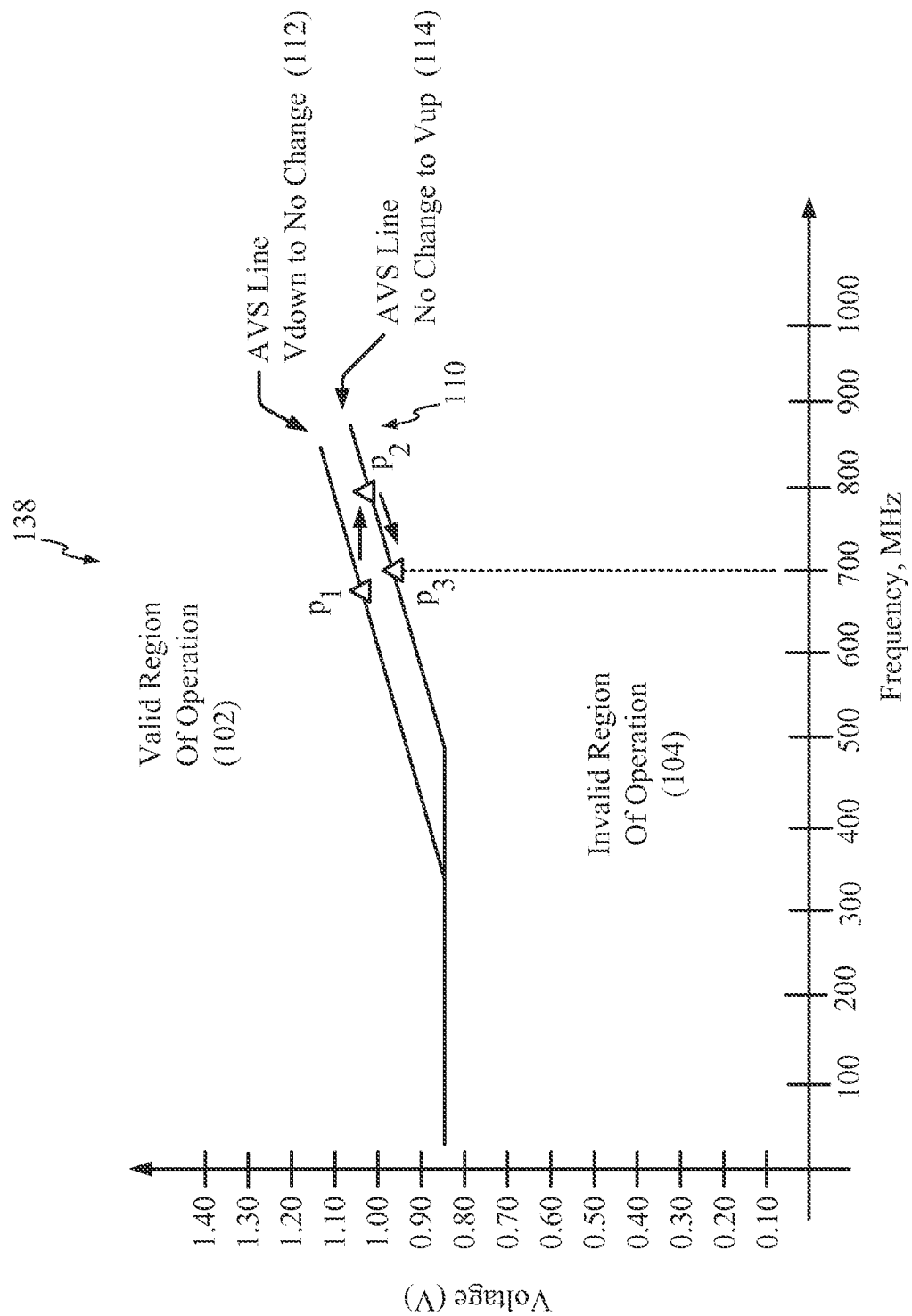
FIG. 10 is an exemplary operating frequency versus voltage level diagram illustrating regions of operation of a functional circuit(s)

In this regard, one embodiment of the AVS 11 is configured to explore the invalid region of operation of the functional circuit(s) 15 during run-time to reduce voltage margin tolerance, such as from AVS line 112 to AVS line 114 in FIG. 8, as an example. Exploring the invalid region of operation allows the AVS module 28 to determine if the voltage margin tolerance can be further reduced given the inherent time measuring constraints of the AVS 11. With reference to FIG. 8 as an example, this embodiment may allow the AVS module 28 to set the voltage level below the AVS line 112 and/or between the AVS lines 112, 114 or to the AVS line 114 for a zero voltage margin tolerance, if desired. In this regard, FIG. 9 is a flowchart illustrating an exemplary process that may be performed by the AVS module 28 to explore the invalid region of operation of the functional circuit(s) 15. As provided therein, the AVS module 28 can periodically initiate an invalid region of operation exploration test (block 120). The AVS module 28 records the current operation frequency and voltage level as a first point in the AVS database 44 (block 122). This first point is labeled $p_1$ on the AVS line 112 illustrated in the exemplary operating frequency versus voltage level diagram 138 in FIG. 10. The exemplary operating frequency versus voltage level diagram 138 in FIG. 10 is similar to the diagram 100 in FIG. 8, but without the DVS line 108 and with some additional information included that will be referenced in the flowchart in FIG. 9.

The AVS module 28 next simulates increasing the operating frequency to determine the invalid region of operation 104 (i.e., where a "Vup" condition occurs) by increasing the delay in the delay lines 30 in the AVS 11 in FIG. 1 (block 124). The AVS module 28 then determines if a "Vup" condition is returned on the delay output signal 42 as a result of the increased delay (block 126). The AVS module 28 continues to incrementally increase the amount of delay provided in the delay lines 30 (block 128) until a "Vup" condition is returned to the AVS module 28 (block 126). Once a "Vup" condition is returned, the AVS module 28 records the current voltage level and the simulated increased operating frequency as a second point in the AVS database 44 (block 130), which is illustrated by example on the AVS line 114 in FIG. 10 as point $p_2$. The goal of this AVS test is to determine if the voltage level can be reduced at the current operating frequency to further reduce voltage margin on or closer to the AVS line 114, but point $p_2$ is at the higher, simulated operating frequency on the AVS line 114. Thus, the AVS module 28 uses the slope of the AVS line 112, which can be determined from voltage levels stored in the AVS database 44, to calculate a third point $p_3$ on the AVS line 114 (block 132). The AVS lines 112, 114 are assumed to have the same slope, thus using the slope of the AVS line 112 along with the operating frequency at point $p_2$ can allow the AVS module 28 to determine the lower voltage level at point $p_3$ on the AVS line 114 for the current operating frequency.

The AVS module 28 can then store the new operating frequency and voltage level point $p_3$ in the AVS database 44 (block 134) and the AVS test ends (block 136). For example, the AVS module 28 can store point $p_3$ in the AVS learned value table 90 (FIG. 7) or the AVS frequency/voltage level table 50 (FIG. 2) to use to set the new voltage level at the current operating frequency. For example, as illustrated in an operating frequency versus voltage level table 140 in FIG. 11, the AVS module 28 may overwrite the new voltage level (e.g., point $p_3$) over a currently stored voltage level for the operating frequency (e.g., point $p_1$) in an existing table in the AVS database 44. As another example, the AVS database 44 may be configured to store the difference between the current voltage level (e.g., point $p_1$) and reduced voltage level for a given operating frequency provided by this test (e.g., point $p_3$) in a voltage level difference table 142 illustrated in FIG. 12. The AVS module 28 would consult the voltage level difference table 142 to determine if the voltage level determined on the AVS line 112 could be further reduced.

After a reset, the AVS module 28 will have not yet discovered the voltage levels for all possible operating frequencies of the functional circuit(s) 15. The AVS module 28 may only determine voltage levels as each given operating frequency in the AVS database 44 is set. Thus, when the AVS module 28 sets a previously unset operating frequency, the AVS module 28 may select an initial voltage level stored in the AVS database 44 for that operating frequency, as previously described. Additional voltage margin may be present for new operating frequency since the initial voltage level value is not an adaptively learned voltage level by the AVS module 28. However, once the AVS module 28 learns a voltage level for a given operating frequency, the AVS module 28 could accelerate the population of voltage levels for operating frequencies in the AVS database 44. The AVS module 28 could be configured to automatically set voltage levels in the AVS database 44 at lower operating frequencies whose current voltage levels are higher than the discovered voltage level. This is possible because if the functional circuit(s) is known to be able to properly operate at an adaptively learned voltage level for a higher operating frequency, then that voltage level is also adequate for operation at lower frequencies.

Figure 13:
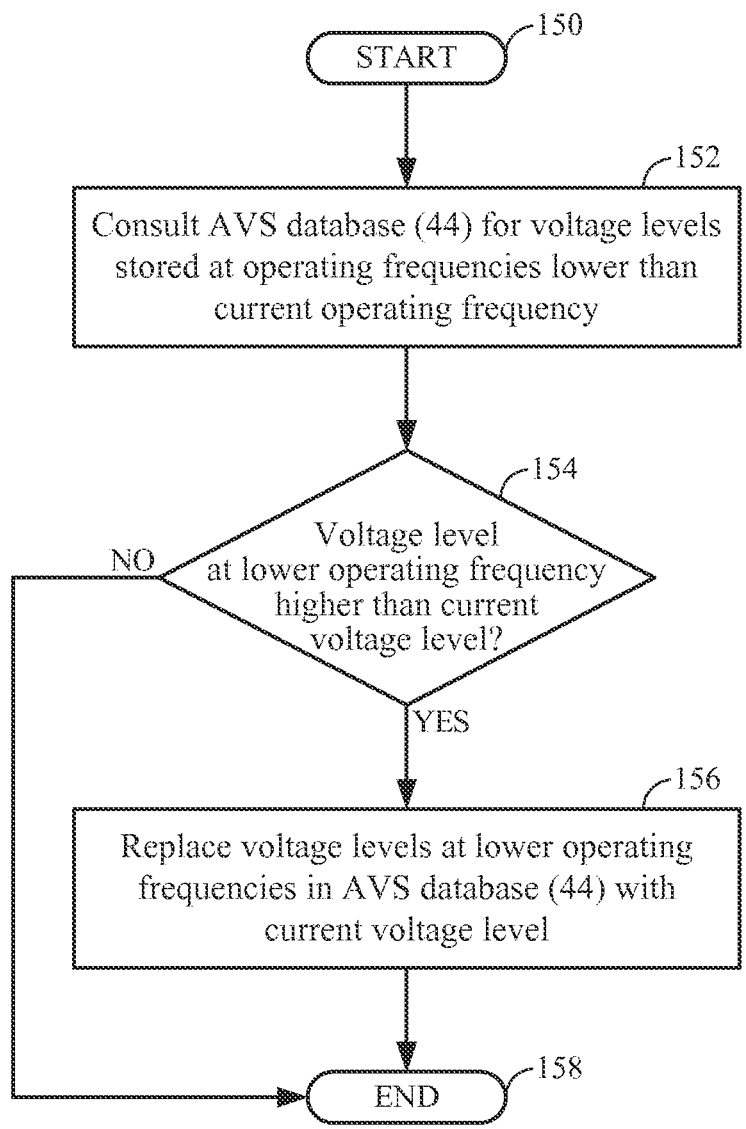
FIG. 13 is a flowchart providing an exemplary process for accelerating the population of voltage levels for given operating frequencies in an AVS database.

In this regard, FIG. 13 is a flowchart that provides an exemplary process that may be performed by the AVS module 28 to accelerate the population of voltage levels for operating frequencies in the AVS database 44. The process may be executed at anytime by the AVS module 28, including once a new operating frequency is set or anytime thereafter. As illustrated in FIG. 13, the process starts (block 150), and the AVS module 28 consults the AVS database 44 for voltage levels stored therein at operating frequencies that are lower than the current operating frequency set by the AVS module 28 (block 152). If the voltage levels stored in the AVS database 44 for any of the lower operating frequencies are higher than the current voltage level (block 154), the AVS module 28 can replace the voltage levels in the AVS database 44 for the lower operating frequencies with the current voltage level (block 156), and the process ends (block 158). Otherwise, the process ends (block 158) without altering the voltage levels for the lower operating frequencies in the AVS database 44. In this manner, the voltage levels for lower operating frequencies in the AVS database 44, including initial voltage levels for example, can be populated quickly with lower voltage levels that are known to maintain proper operation of the functional circuit(s) 15.

Figure 14:
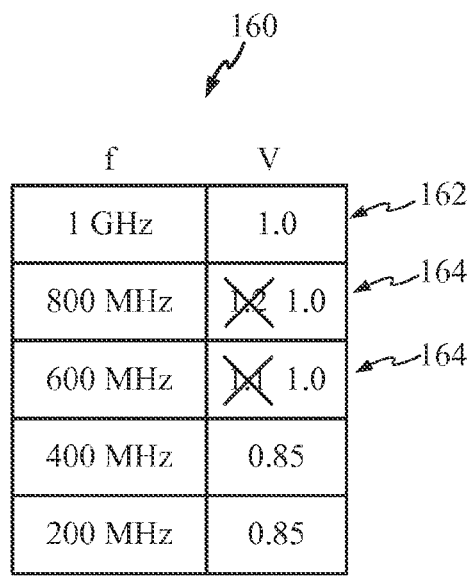
FIG. 14 is an example of accelerated population of voltage levels in an AVS database.

FIG. 14 illustrates an exemplary AVS operating frequency/voltage level table 160 that may be stored in the AVS database 44 of FIG. 1 to further illustrate accelerated population of voltage levels. Assume for this example that the AVS module 28 determined a voltage level of 1.0 V for an operating frequency of 1 GHz, as illustrated in entry 162 in the AVS operating frequency/voltage level table 160. If any initial voltage levels in the AVS operating frequency/voltage level table 160 are higher than 1.0 V, such as entries 164, the AVS module 28 could replace the voltage levels for entries 164 with 1.0 V, as illustrated in FIG. 14. Voltage margin is reduced the first time the AVS module 28 sets the operating frequency at the frequency of the entries 164 in this example.

Figure 15:
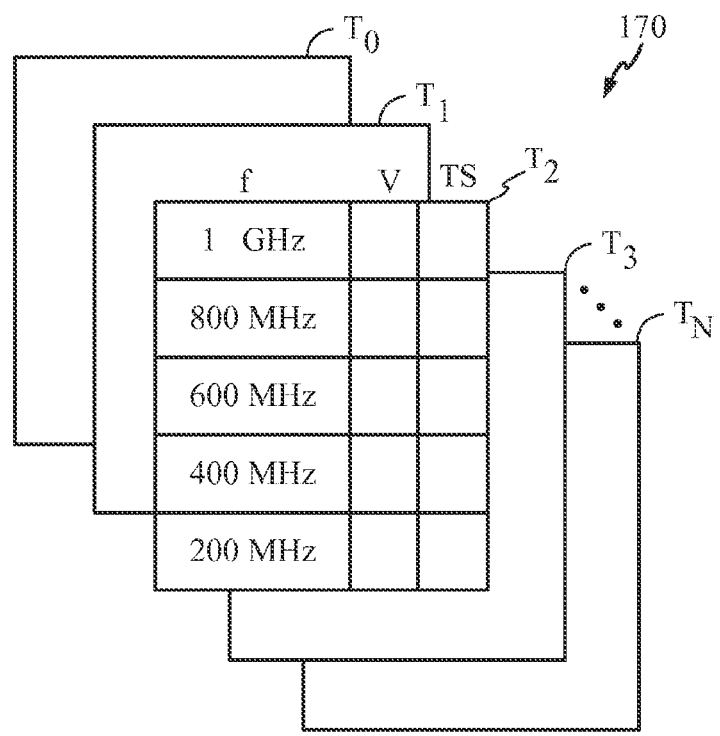
FIG. 15 is an exemplary AVS operating frequency/voltage level tables stored in an AVS database for different operating temperatures.

Another embodiment of the AVS 11 includes the incorporation of a temperature sensor in the AVS 11. A temperature sensor 48 has already been previously discussed as being an optional component in the AVS 11 in FIG. 1. If the temperature sensor 48 is included in the AVS 11, the AVS module 28 can store determined voltage levels based on the current operating temperature in the AVS database 44. As previously discussed, operating temperature level can shift the voltage levels for proper functional circuit(s) 15 operation. Thus, by storing voltage levels further based on operating temperature level, the AVS module 28 may avoid or reduce voltage margin while ensuring proper operation of the functional circuit(s) 15. In this regard, FIG. 15 provides a plurality of exemplary AVS operating frequency/voltage level tables 170 each corresponding to a different operating temperature $T_0$ to $T_N$. Thus, when the AVS module 28 consults the AVS database 44, as provided in embodiments disclosed herein, to determine the voltage level for a given operating frequency, the AVS module 28 can use the operating temperature levels received from the received temperature level signal 46 from the temperature sensor 48 to determine which table 170 in the AVS database 44 to consult. Further, the AVS module 28 can use the operating temperature levels received from the temperature sensor 48 to determine which table 170 in the AVS database 44 to populate with initial, learned, explored, accelerated voltage levels according to the embodiments disclosed herein, or any other voltage levels desired. The AVS module 28 may be configured to interpolate or extrapolate voltage levels based on multiple AVS operating frequency/voltage level tables 170 if an AVS operating frequency/voltage level table 170 is not provided in the AVS database 44 for a received temperature level from the temperature sensor 48. Storing voltage levels in the AVS database 44 by operating temperature level could prolong the freshness of the voltage levels in the AVS database 44 since certain operating temperatures may not often occur at different operating frequencies. Thus, an optional time element could be incorporated into the AVS database 44 to allow the AVS module 28 to invalidate and/or return voltage level entries beyond a certain age to initial voltage levels.

With any of the aforementioned embodiments, it is possible that the AVS module 28 could receive a "Vup" condition. The parameters and/or algorithms in the AVS module 28 and/or the AVS database 44 may not perfectly account for all delay variations for all operating frequencies of the functional circuit(s) 15. Thus, in another embodiment, the AVS 11 is configured to "back up" or "back out" a previously stored or learned voltage level for a current operating frequency if a "Vup" condition was generated at the current operating frequency. A "back out" or "back up" of a voltage level in the AVS database 44 includes increasing the voltage level for a given operating frequency in the AVS database 44 to increase voltage margin if a "Vup" condition resulted. A "Vup" condition is indicative of negative voltage margin, wherein a valid region of operation of the functional circuit(s) 15 requires either zero or a positive voltage margin.

Figure 16:
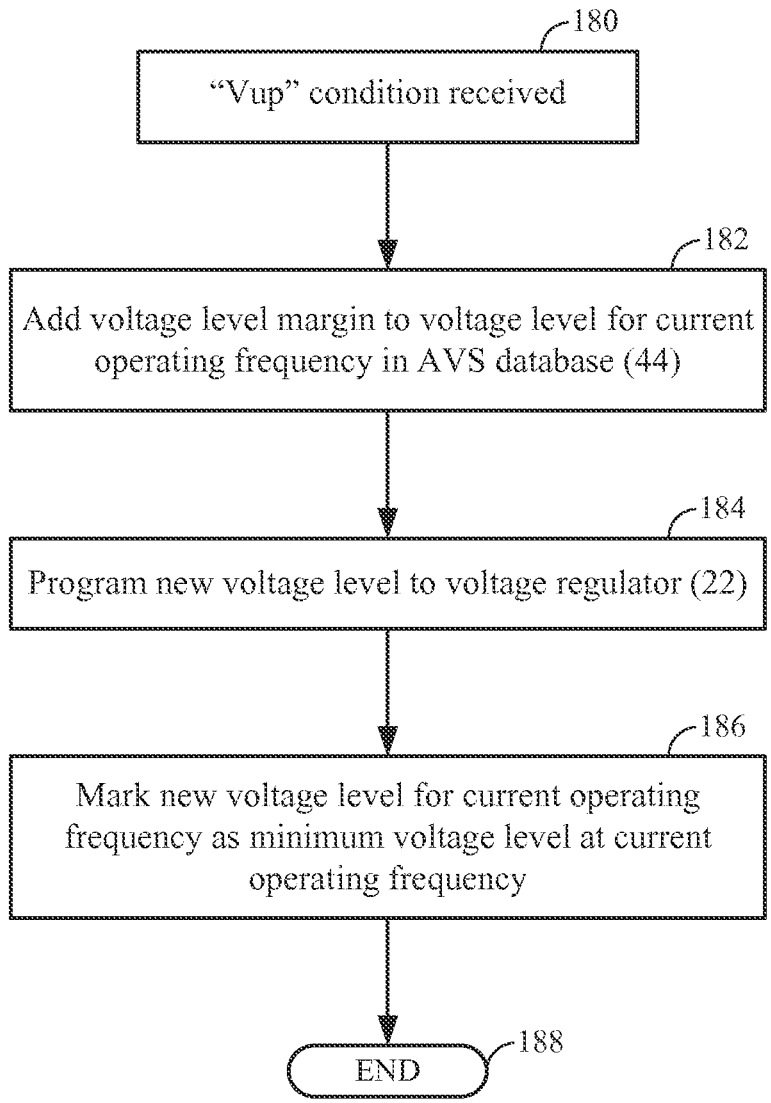
FIG. 16 is a flowchart providing an exemplary process for adding voltage margin to a voltage level when the functional circuit(s) enters into an invalid region of operation.

In this regard, FIG. 16 provides a flowchart of an exemplary process for increasing voltage margin when an unintentional hardware reset believed to be caused by a too low voltage level is detected. For example, a characteristic of low voltage level that caused a reset or fault may be the generation of cache parity errors, which are detectable. This hardware reset or fault may result in a "Vup" condition received by the AVS module 28 in the AVS 11 of FIG. 1. In this case, if such errors occur once or more at a given operating frequency, the voltage level corresponding to the operating frequency can be increased by the AVS module 28 to increase voltage margin to avoid future resets.

In this regard, as an example, the AVS module 28 may be configured to jump to an exception handler via interrupt or otherwise when a "Vup" condition is received (block 180), as illustrated in FIG. 16. In this instance, the AVS module 28 then adds the voltage margin to the voltage level stored in the AVS database 44 associated with the current operating frequency (block 182). The AVS module 28 sets the voltage level setting signal 20 to cause the voltage regulator 22 to add the voltage margin to the voltage level provided to the functional circuit(s) 15 (block 184). The AVS module 28 may then mark the new voltage level at the current operating frequency as a minimum voltage level which cannot be penetrated by the AVS module 28 upon reset and further operation in this embodiment (block 186), and the process ends (block 188). In other words, once it is learned that a given voltage level generated a "Vup" condition in the AVS 11, the AVS module 28 should not reduce the voltage level for the current operating frequency in the future. Alternatively, the AVS module 28 could be configured to allow the voltage level to be overwritten in the AVS database 44 if a lower voltage level is determined during future, normal operation.

The AVS database 44 may be configured to store a minimum voltage level for the functional circuit(s) 15 for all operating frequencies to ensure that the voltage level set by the AVS module 28 does not fall below a minimum voltage level for operation of the functional circuit(s) 15. In this regard, FIG. 17 illustrates an exemplary minimum voltage level limit table 190 that may be stored in the AVS database 44. The AVS module 28 may be configured to consult the minimum voltage level limit table 190 in the AVS database 44 for a given current operating frequency before a voltage level is set. If the voltage level determined by the AVS module 28 is lower than the minimum voltage level in the minimum voltage level limit table 190 for the current operating frequency, the AVS module 28 will set the voltage level to the voltage level in the minimum voltage level limit table 190. The minimum voltage level limit table 90 may initially contain the same voltage level for all operation frequencies (e.g., 0.85 V). However, if the AVS module 28 is configured to add voltage margin for a given operating frequency upon a "Vup" condition, the added voltage margin can be added to the minimum voltage level in the minimum voltage level limit table 190. For example, if a "Vup" condition was received at an operating frequency of 600 MHz, the voltage level was 0.90 V, and the added voltage margin was 0.05 V, a minimum voltage level of 0.95 V may be stored for an operating frequency of 600 MHz in the minimum voltage level limit table 190, as illustrated in FIG. 17.

Figure 18:
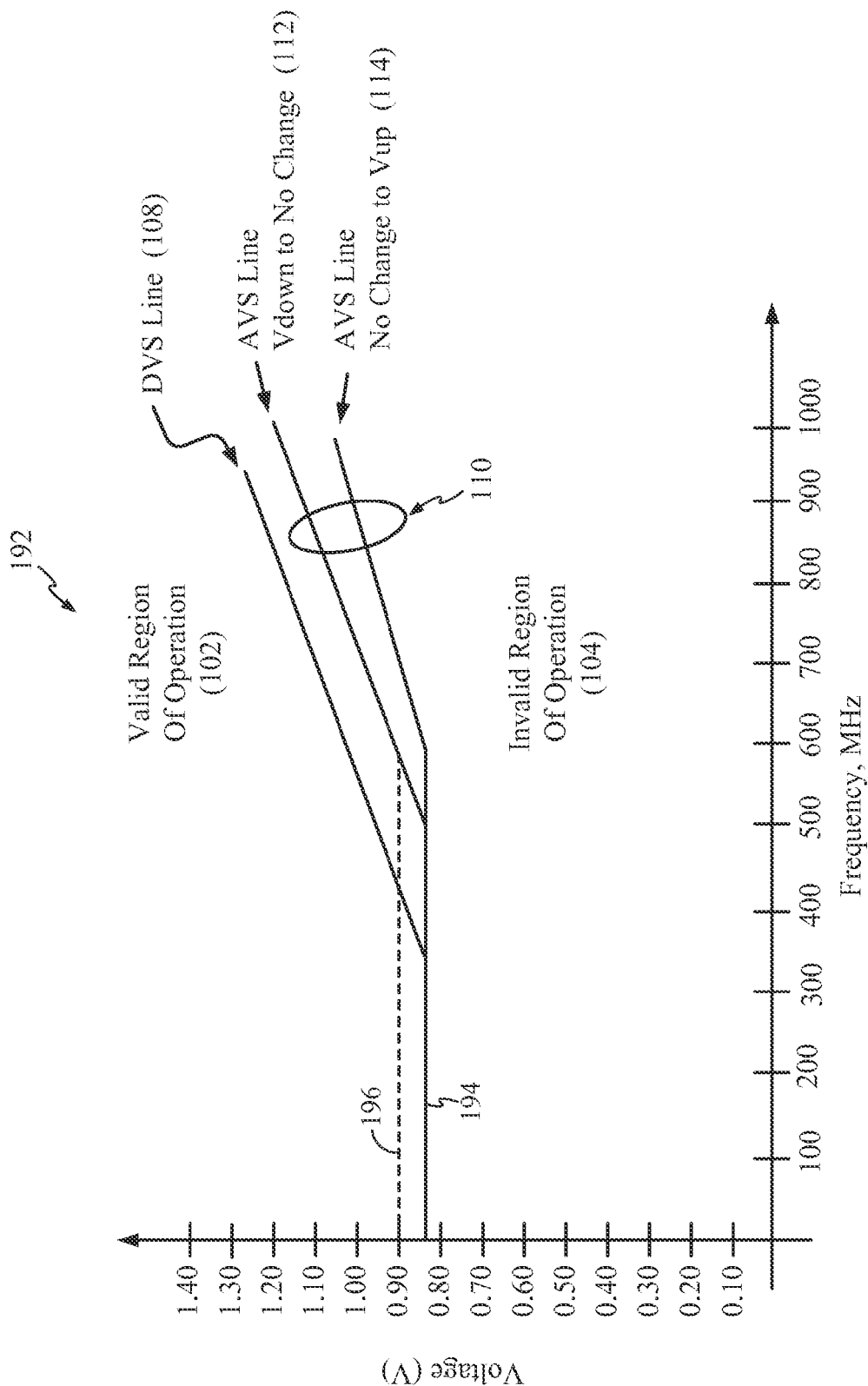
FIG. 18 is an exemplary operating frequency versus voltage diagram illustrating different regions of operation for a functional circuit(s)

In another embodiment, the AVS 11 may be configured to compensate the voltage level for negative bias temperature instability (NBTI). The NBTI effect slowly raises the minimum voltage level necessary for some semiconductor devices to properly operate over time. For example, a specific semiconductor process may be characterized in that the NBTI effect raises the minimum voltage level by 50 mV over twenty-four (24) months of power-on operation as illustrated in the exemplary operating frequency/voltage level diagram 192 in FIG. 18. As illustrated therein, an initial minimum voltage level 194 is 0.85 V for the functional circuit(s) 15. However, due the NBTI effect, a subsequent minimum voltage level 196 may raise to 0.9 V over time. The AVS module 28 can be configured to compensate for NBTI by tracking total power time and applying a correction factor to previously known voltage level minimums stored in the AVS database 44. The correction factor may be applied to an absolute minimum voltage level for the functional circuit(s) 15 in the AVS database 44, such as in the minimum voltage level limit table 190 illustrated in FIG. 17 for example. Alternatively, the correction factor may be applied to the minimum voltage levels in an AVS table, including any of the tables previously described herein. The AVS module 28 can be configured to enforce the compensated minimum voltage level setting in the AVS database 44 if the voltage level settings for any of the operating frequencies stored therein are below the minimum voltage level setting.

Figure 19:
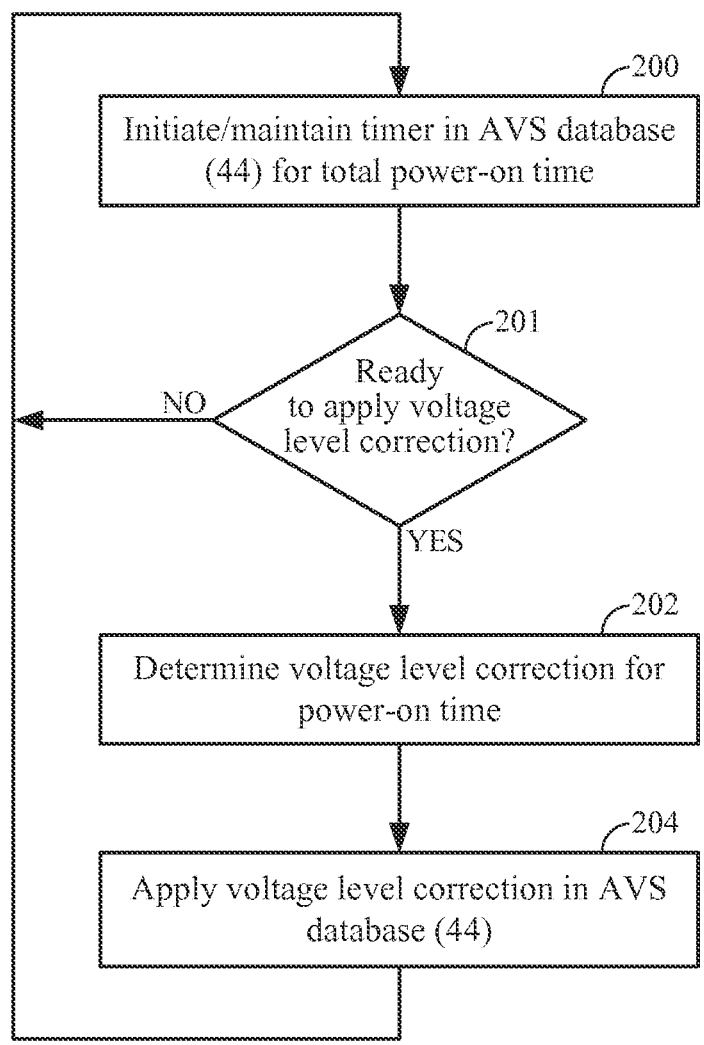
FIG. 19 is a flowchart providing an exemplary process for adding a voltage level correction to voltage level(s) in an AVS database based on a negative bias temperature instability (NBTI) effect.

In this regard, FIG. 19 provides a flowchart of an exemplary process of the AVS 11 compensating voltage levels for the functional circuit(s) 15 due to NBTI. The process may be performed periodically on each iteration of the tuning loop 24 wherein the AVS module 28 determines the next operating frequency for the functional circuit(s) 15 or less frequently. The process may be initiated at an aging indicator, which may be predetermined time values either based on polling a timer or an interrupt handler, as examples. The AVS module 28 may initiate and maintain a timer in the AVS database 44 upon reset to track the power-on time (block 200). The timer may be contained in non-volatile memory in the AVS database 44 to be maintained over power cycles. Once the AVS module 28 determines that a power level correction should be applied based on the elapsed time (block 201), the AVS module 28 determines the voltage level correction should be applied for the total power-on time based on the timer value in the AVS database 44 (block 202). The voltage level correction may be 0 V or greater than 0V. Further, the voltage level correction may be offset to only the minimum voltage level for the functional circuit(s) 15 or an offset to all AVS voltage level settings stored in the AVS database 44. Further, the AVS module 28 could also be configured to compensate the voltage levels stored in the AVS database 44 before being applied during operation without changing or overwriting the voltage level settings determined by other means and stored in the AVS database 44, including those described previously above. The voltage level correction is applied to the AVS database 44 in either case (block 204). The process repeats (block 200).

Figure 20:
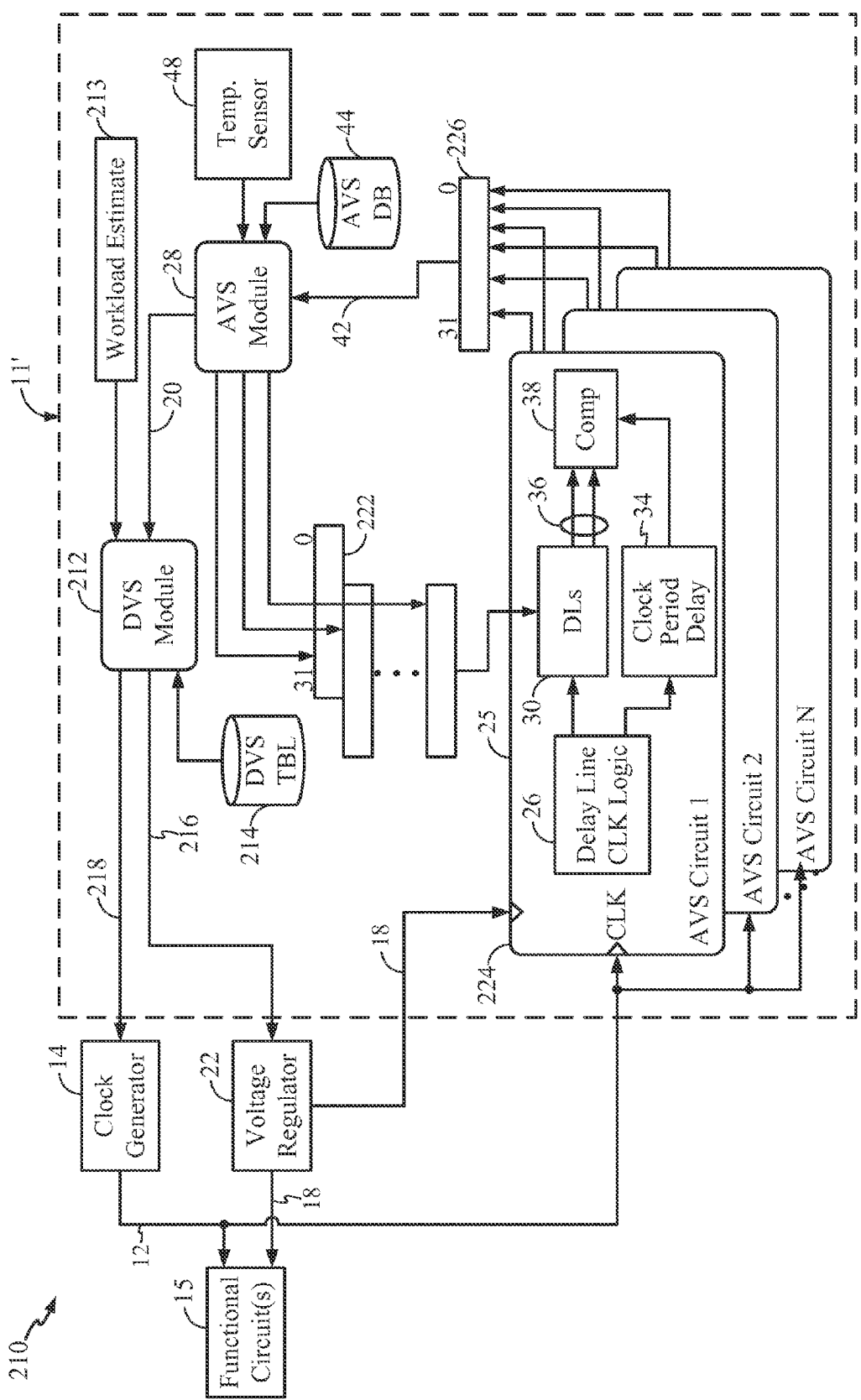
FIG. 20 is a schematic diagram of another exemplary AVS system.

FIG. 20 illustrates another exemplary AVS system 210. The AVS system 210 includes an AVS 11' that is similar to the AVS 11 in FIG. 1. Common components are labeled with common element numbers. The AVS 11' includes the AVS module 28, AVS database 44, delay line clock logic 26, programmable delay lines 30, clock period delay 34, comparators 38, and temperature sensor 48 similar to the AVS 11 of FIG. 1. The AVS operation to set the minimum voltage level can operate according to any of the previously described embodiments. However, the AVS 11' in FIG. 20 also includes a dynamic voltage scaler (DVS) module 212 and DVS table 214. The AVS 11' in FIG. 20 may have been an altered or updated design where the AVS module 28 and AVS database 44 were added to a system already including the DVS module 212 and DVS table 214. The DVS module 212 performs dynamic voltage scaling by communicating a voltage level setting signal 216 to the voltage regulator 22 according to a workload estimate 213 for the functional circuit(s) 15. However, in this embodiment, the AVS module 28 is also provided to adaptively scale the voltage level based on delay variation conditions in the functional circuit(s) 15. The AVS module 28 provides a determined AVS voltage level or voltage level adjustment to the DVS module 212 in response to a request by the DVS module 212 to the AVS module 28. The AVS module 28 consults the AVS database 44 based on a current and target operating frequency provided from the DVS module 212 to the AVS module 28. The DVS module 212 is configured to set the voltage level setting signal 20 based on the voltage level stored in the DVS table 214 containing voltage levels corresponding to operating frequencies as further adjusted by a voltage level or margin provided from the AVS module 28 back to the DVS module 212. The DVS module 212 also generates an operating frequency setting signal 218 to set the operating frequency of the clock signal 12 generated by the clock generator 14 to control the switching of the functional circuit(s) 15.

The voltage level determined by the AVS module 28 should ideally be the same or lower than the voltage level determined by the DVS module 212 since the AVS module 28 is configured to adaptively further avoid or reduce voltage margin. The AVS module 28 can set the delay in the delay lines (DLs) 30 of the delay circuit 25 via a delay line setting signal 220 as illustrated in FIG. 20 to find the invalid region of operation of the functional circuit(s) 15, as previously described. In this embodiment, the delay line setting signal 220 is a 32-bit delay register 222 that controls the amount of delay. The delay settings may or may not be linear. The delay line setting signal 220 with the value of the 32-bit delay register 222 is communicated to the delay lines 30, as previously discussed, in a plurality of AVS circuits 224 1-N. A plurality of delay registers 222 may be provided, each controlling the amount of delay in a given AVS circuit 224. Although not shown, each AVS circuit 224 includes delay line clock logic 26, delay lines 30, comparators 38, and clock period delay 34 similar to that provided in the AVS 11 of FIG. 1. The AVS circuits 224 include delay logic to simulate the delay in various types of circuits included in the functional circuit(s) 15. Any number of AVS circuits 224 desired can be provided. The operating frequency of the logic in the AVS circuit 224 and power are also provided from the clock signal 12 and voltage signal 18 generated by the clock generator 14 and voltage regulator 22, respectively. The comparators 38 provide timing margin information in another 32-bit delay register 226 to be communicated over the delay output signal 42 to provide timing margin information to the AVS module 28. The timing information is used to determine the next operating frequency and voltage level as previously described.

The AVS systems and AVSs and related methods described herein may be provided in discrete hardware, or both in hardware and software components. The AVS systems and AVSs and related methods described herein may be used to set an operating frequency and voltage level for any circuit or system, including but not limited to a synchronous digital circuit, central processing unit (CPU) system, and a memory circuit or system. If employed in a memory circuit or system, the memory circuit or system may employ any type of memory. Examples include, without limitation, static random access memory (RAM) (SRAM), dynamic RAM (DRAM), synchronous DRAM (SDRAM), data-double-rate (DDR) SDRAM, data-double-rate-two (DDR2) SDRAM, data-double-rate-three (DDR3) SDRAM, Mobile DDR (MDDR) SDRAM, low-power (LP) DDR SDRAM, and LP DDR2 SDRAM. Any of the components of a memory circuit or system whose operating frequency and voltage level are controlled by the AVSs can be in any voltage domain among a plurality of voltage domains as long as the memory is powered by a voltage domain providing a sufficient voltage level to keep the memory cell functional, if required by the technology and/or design of the memory.

The AVS systems and AVSs according to the designs and methods discussed herein may be included or integrated in a semiconductor die, integrated circuit, and/or device, including an electronic device and/or processor-based device or system. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

Figure 21:
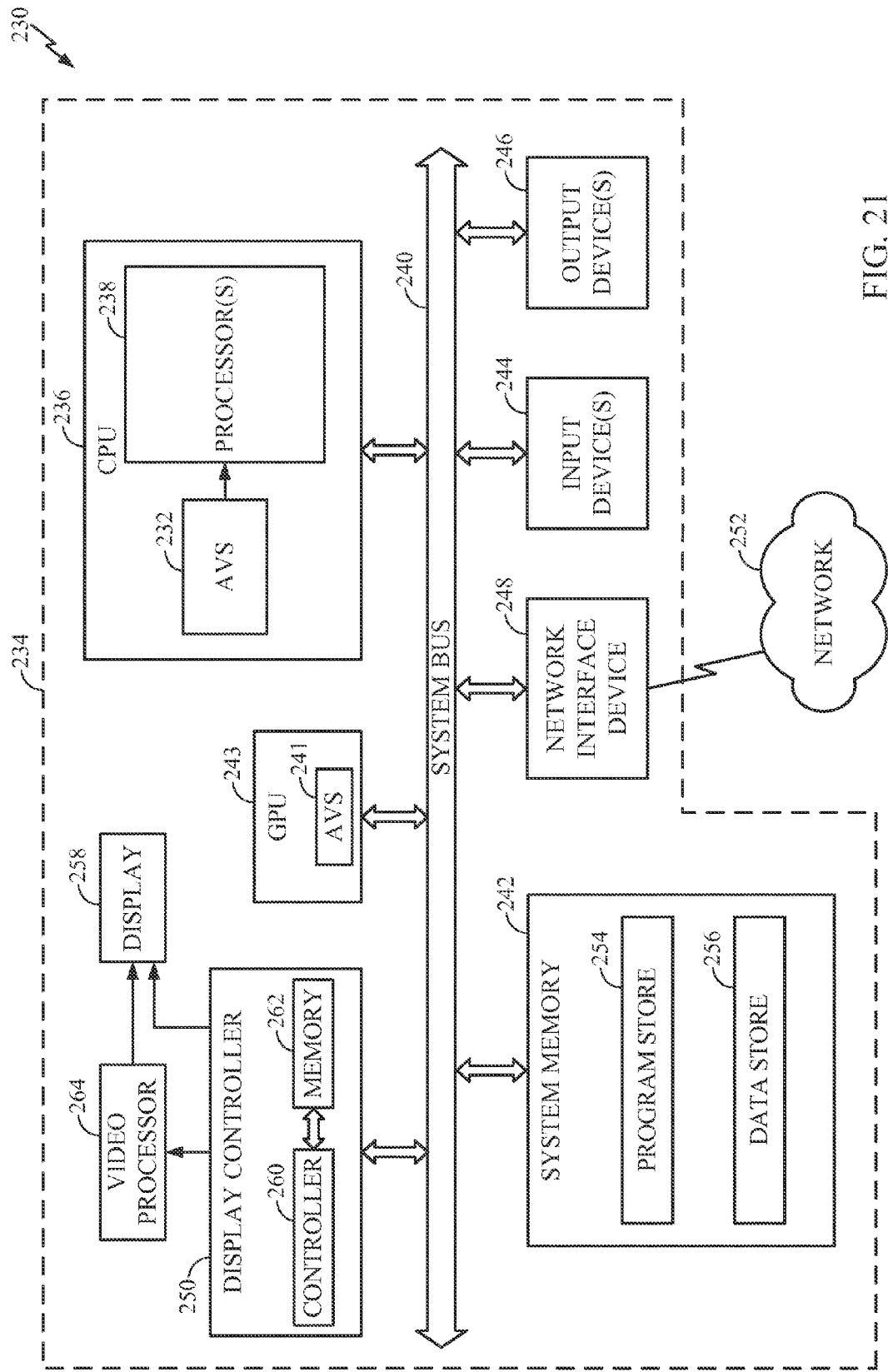
FIG. 21 is a block diagram of an exemplary central processing unit (CPU) functional circuit and related system employing an AVS.

FIG. 21 illustrates a processor-based system 230 that may employ an AVS 232 and related circuits described above. The processor-based system 230 may be included in an electronic device 234. The AVS 232 may be included in a CPU 236 to control an operating frequency of a clock signal and voltage level of a voltage signal provided to a processor(s) 238 in the CPU 236. The CPU 236 is coupled to a system bus 240, which interconnects the other devices included in the processor-based system 230. An AVS 241 may also be included in a graphic processor unit (GPU) 243 coupled to the system bus 240. As is well known, the CPU 236 and/or GPU 243 can communicate with these other devices by exchanging address, control, and data information over the system bus 240. These devices may include any types of devices. As illustrated in FIG. 21, these devices may include system memory 242, one or more input devices 244, one or more output devices 246, a network interface device 248, and a display controller 250, as examples.

The one or more input devices 244 may include any type of input device, including but not limited to input keys, switches, voice processors, etc. The one or more output devices 246 may include any type of output device, including but not limited to audio, video, other visual indicators, etc. The network interface device 248 may be any device configured to allow exchange of data to and from a network 252. The network 252 may be any type of network, including but not limited to a wired or wireless network, private or public network, a local area network (LAN), a wide local area network (WLAN), and the Internet. The network interface device 248 may support any type of communication protocol desired.

The CPU 236 may also access the system memory 242 over the system bus 240. The system memory 242 may include static memory and/or dynamic memory. The system memory 242 may include a program store 254 and a data store 256 for the CPU 236. The CPU 236 may also access the display controller 250 over the system bus 240 to control information sent to a display 258. The display controller 250 may include a memory controller 260 and memory 262 to store data to be sent to the display 258 in response to communications with the CPU 236. The display controller 250 communicates the display information to the display 258 via a video processor 264, which processes the information to be displayed into a format suitable for the display 258. The display 258 may include any type of display, including but not limited to a cathode ray tube (CRT), a liquid crystal display (LCD), a plasma display, etc.

Those of skill in the art would further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope herein.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium is coupled to the processor such that a processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An adaptive voltage scaler (AVS), comprising:
   at least one delay circuit configured to receive an input signal and delay the input signal by a delay amount relating to at least one delay path of a functional circuit to produce a delay output signal; and
   an AVS circuit responsive to the delay output signal, the AVS circuit configured to:
      generate a voltage level setting signal based on a target operating frequency for the functional circuit and delay information in the delay output signal; and
      increase the delay amount of the at least one delay path to simulate an increased operating frequency for the functional circuit to explore an invalid region of operation of the functional circuit.

2. The AVS of claim 1, wherein the AVS circuit is further configured to determine the increase in the delay amount of the at least one delay path entering the explored invalid region of operation of the functional circuit.

3. The AVS of claim 2, wherein the AVS circuit is further configured to determine a current voltage level for a simulated increased operating frequency for the functional circuit due to the increase in the delay amount of the at least one delay path entering the explored invalid region of operation of the functional circuit.

4. The AVS of claim 3, wherein the AVS circuit is further configured to determine a new voltage level for a current operating frequency based on the simulated increased operating frequency.

5. The AVS of claim 4, wherein the AVS circuit is further configured to generate a new voltage level setting signal based on the new voltage level for the current operating frequency based on the simulated increased operated frequency.

6. The AVS of claim 5, wherein the AVS circuit is configured to store the new voltage level in a database.

7. The AVS of claim 6, wherein the AVS circuit is further configured to determine if the new voltage level has been previously learned for the functional circuit in the database.

8. The AVS of claim 7, wherein the database is configured to store an indicator indicating whether the new voltage level has been previously learned by the AVS circuit for the functional circuit.

9. The AVS of claim 5, wherein the AVS circuit is further configured to generate the new voltage level setting signal without waiting for the input signal to settle if the new voltage level has been previously learned for the functional circuit.

10. The AVS of claim 6, wherein the AVS circuit is further configured to mark a new increased operating frequency in the database for the new voltage level that caused the functional circuit to operate in the explored invalid region of operation.

11. The AVS of claim 3, wherein the AVS circuit is further configured to determine a voltage margin tolerance between the current voltage level for a current operating frequency of the functional circuit and the simulated increased operating frequency at the explored invalid region of operation.

12. The AVS of claim 11, wherein the AVS circuit is configured to store the voltage margin tolerance in a database.

13. The AVS of claim 1, wherein the AVS circuit is further configured to apply a voltage level correction to the voltage level setting signal based on an aging indicator of the functional circuit.

14. The AVS of claim 4, wherein the AVS circuit is further configured to, repeatedly, on a periodic basis:
   generate the voltage level setting signal based on the target operating frequency for the functional circuit and the delay information in the delay output signal;
   increase the delay amount of the at least one delay path to simulate the increased operating frequency for the functional circuit to explore the invalid region of operation of the functional circuit;
   determine the increase in the delay amount of the at least one delay path entering the explored invalid region of operation of the functional circuit;
   determine the current voltage level for the simulated increased operating frequency for the functional circuit due to the increase in the delay amount of the at least one delay path entering the explored invalid region of operation of the functional circuit; and
   determine the new voltage level for the current operating frequency based on the simulated increased operating frequency.

15. The AVS of claim 1, wherein the AVS circuit is at least partially controllable by software.

16. The AVS of claim 1, wherein the at least one delay path is comprised of at least one programmable delay path.

17. The AVS of claim 1 integrated in at least one semiconductor die.

18. The AVS of claim 1 integrated into a device selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

19. An adaptive voltage scaler (AVS), comprising:
at least one means for receiving an input signal and delaying the input signal by a delay amount relating to at least one delay path of a functional circuit to produce a delay output signal; and
an means for adaptive voltage scaling (AVS) responsive to the delay output signal, for:
generating a voltage level setting signal based on a target operating frequency for the functional circuit and delay information in the delay output signal; and
increasing the delay amount of the at least one delay path to simulate an increased operating frequency for the functional circuit to explore an invalid region of operation of the functional circuit.

20. A method of scaling a voltage level for a functional circuit, comprising:
receiving an input signal in at least one delay circuit;
delaying the input signal in the at least one delay circuit by a delay amount relating to at least one delay path of a functional circuit to produce a delay output signal;
generating a voltage level setting signal based on a target operating frequency for the functional circuit and delay information in the delay output signal; and
increasing the delay amount of the at least one delay path to simulate an increased operating frequency for the functional circuit to explore an invalid region of operation of the functional circuit.

21. The method of claim 20, further comprising increasing the delay amount of the at least one delay path entering the explored invalid region of operation of the functional circuit.

22. The method of claim 21, further comprising determining a current voltage level for the simulated increased operating frequency for the functional circuit due to increasing the delay amount of the at least one delay path entering the explored invalid region of operation of the functional circuit.

23. The method of claim 22, further comprising determining a new voltage level for a current operating frequency based on the simulated increased operating frequency.

24. The method of claim 23, further comprising generating a new voltage level setting signal based on the new voltage level for the current operating frequency based on the simulated increased operating frequency.

25. The method of claim 24, wherein an adaptive voltage scaler (AVS) circuit is configured to determine if the new voltage level has been previously learned for the functional circuit in a database.

26. The method of claim 25, wherein the AVS circuit is further configured to generate the new voltage level setting signal without waiting for the input signal to settle if the new voltage level has been previously learned for the functional circuit.

27. The method of claim 25, wherein the AVS circuit is further configured to mark a new increased operating frequency in the database for the new voltage level that caused the functional circuit to operate in the explored invalid region of operation.

28. The method of claim 22, further comprising determining a voltage margin tolerance between the current voltage level for a current operating frequency of the functional circuit and the simulated increased operating frequency at the explored invalid region of operation.

29. A non-transitory computer readable medium having stored thereon computer executable instructions to cause a processor-based adaptive voltage scaling (AVS) circuit to:
generate a voltage level setting signal based on a target operating frequency for a functional circuit and delay information in a delay output signal generated by an input signal delayed by at least one delay circuit by a delay amount relating to at least one delay path of the functional circuit; and
increase the delay amount of the at least one delay path to simulate an increased operating frequency for the functional circuit to explore an invalid region of operation of the functional circuit.

* * * * *